(12) United States Patent
Suzuki et al.

(10) Patent No.: US 10,818,834 B2
(45) Date of Patent: Oct. 27, 2020

(54) MOUNTING STRUCTURE, ULTRASONIC DEVICE, ULTRASONIC PROBE, ULTRASONIC APPARATUS, ELECTRONIC APPARATUS, AND MANUFACTURING METHOD OF MOUNTING STRUCTURE

(71) Applicant: Seiko Epson Corporation, Tokyo (JP)

(72) Inventors: Hironori Suzuki, Chino (JP); Hiroshi Matsuda, Chino (JP); Koji Ohashi, Matsumoto (JP)

(73) Assignee: Seiko Epson Corporation (JP)

(*) Notice: Subject to any disclaimer, the term of this patent is extended or adjusted under 35 U.S.C. 154(b) by 480 days.

(21) Appl. No.: 15/674,950

(22) Filed: Aug. 11, 2017

(65) Prior Publication Data
US 2018/0053888 A1 Feb. 22, 2018

(30) Foreign Application Priority Data
Aug. 19, 2016 (JP) .................................. 2016-161046

(51) Int. Cl.
*H01L 41/311* (2013.01)
*H01L 41/053* (2006.01)
(Continued)

(52) U.S. Cl.
CPC ........ *H01L 41/0533* (2013.01); *B06B 1/0207* (2013.01); *B06B 1/0607* (2013.01); *B06B 1/0622* (2013.01); *B06B 1/0688* (2013.01); *H01L 41/0472* (2013.01); *H01L 41/0475* (2013.01); *H01L 41/0973* (2013.01);
(Continued)

(58) Field of Classification Search
CPC .......................... H01L 41/0533; B06B 1/0207
See application file for complete search history.

(56) References Cited

U.S. PATENT DOCUMENTS 7,722,164 B2 * 5/2010 Watanabe ............ B41J 2/14233
347/70
9,530,744 B2 * 12/2016 Oi ........................... H01L 24/13
(Continued)

FOREIGN PATENT DOCUMENTS

JP 2001-127102 A 5/2001
JP 2006-339278 A 12/2006
(Continued)

*Primary Examiner* — Thomas M Dougherty
*Assistant Examiner* — Karen B Addison
(74) *Attorney, Agent, or Firm* — Harness, Dickey & Pierce, P.L.C.

(57) ABSTRACT

A mounting structure includes a first substrate which has a first surface on which a functional element is provided, a second substrate that has a second surface facing the first surface, a wiring portion that is provided at a position which is different from a position of the functional element on the first surface, has a third surface facing the second surface, and is electrically connected to the functional element, and a conduction portion that is provided on the second surface, protrudes toward the first surface, and is connected to the third surface so as to be electrically connected to the functional element, in which an area of the third surface is larger than an area of a first end section of the wiring portion on the first substrate side in a plan view which is viewed from a thickness direction of the first substrate and the second substrate.

19 Claims, 19 Drawing Sheets

(51) Int. Cl.
  *B06B 1/06* (2006.01)
  *B06B 1/02* (2006.01)
  *H01L 41/047* (2006.01)
  *H01L 41/09* (2006.01)
  *H01L 41/04* (2006.01)

(52) U.S. Cl.
  CPC ........ *H01L 41/311* (2013.01); *B06B 2201/55* (2013.01); *B06B 2201/56* (2013.01); *H01L 41/042* (2013.01); *H01L 41/0477* (2013.01)

(56) References Cited

U.S. PATENT DOCUMENTS

| | | | | |
|---|---|---|---|---|
| 10,085,720 | B2* | 10/2018 | Kiyose | .................... B06B 1/067 |
| 2007/0076061 | A1 | 4/2007 | Watanabe et al. | |
| 2010/0147570 | A1* | 6/2010 | Fukuda | ................ H05K 3/4007 |
| | | | | 174/258 |
| 2013/0098670 | A1 | 4/2013 | Inoue et al. | |
| 2013/0100626 | A1 | 4/2013 | Inoue et al. | |
| 2015/0228551 | A1 | 8/2015 | Oi et al. | |
| 2016/0058417 | A1* | 3/2016 | Kiyose | ................ G01S 7/52079 |
| | | | | 600/472 |

FOREIGN PATENT DOCUMENTS

| | | |
|---|---|---|
| JP | 2007-097280 A | 4/2007 |
| JP | 2007-180166 A | 7/2007 |
| JP | 2009-252882 A | 10/2009 |
| JP | 2013-093404 A | 5/2013 |
| JP | 2013-093405 A | 5/2013 |
| JP | 2015-149459 A | 8/2015 |
| JP | 2016-049193 A | 4/2016 |
| WO | 2009/031586 A1 | 3/2009 |

\* cited by examiner

MOUNTING STRUCTURE, ULTRASONIC DEVICE, ULTRASONIC PROBE, ULTRASONIC APPARATUS, ELECTRONIC APPARATUS, AND MANUFACTURING METHOD OF MOUNTING STRUCTURE

BACKGROUND

1. Technical Field

The present invention relates to a mounting structure, an ultrasonic device, an ultrasonic probe, an ultrasonic apparatus, an electronic apparatus, and a manufacturing method of the mounting structure.

2. Related Art

In a case where an electronic component is mounted on a circuit substrate, there is a mounting method in which a wiring on the circuit substrate side is electrically connected to a wiring on the electronic component side via a bump electrode (for example, refer to JP-A-2007-180166).

JP-A-2007-180166 discloses the electronic component in which an electronic element (functional element) such as an IC chip and a conductive film as a metal wiring connected to the electronic element are formed on a substrate. The conductive film is extracted from the functional element to a surface of a resin protrusion formed at a peripheral edge portion of the substrate. The resin protrusion and the conductive film covering the surface of the resin protrusion form a bump electrode. The circuit substrate is a substrate on which a liquid crystal panel is formed, and an electrode terminal is formed outside a region in which liquid crystal is disposed. The electronic component is mounted on the circuit substrate in a state in which the bump electrode on the electronic component side is brought into contact with the electrode terminal on the circuit substrate side.

However, in the configuration disclosed in JP-A-2007-180166, the electrode terminal is brought into contact with the bump electrode at the peripheral edge portion of the circuit substrate which does not face the functional element. In other words, the circuit substrate and the electronic component are connected to each other at a position separated from the functional element. In this case, a wiring connecting the electrode terminal of the circuit substrate at the peripheral edge portion to the functional element is necessarily formed, and thus this is not suitable for high-density integration of the functional element. In other words, in a case where a plurality of functional elements are provided on a substrate, a wiring configuration for each functional element is complicated, resistance of each wiring increases, or the influence of parasitic capacitance between adjacent wirings increases. In contrast, in a case where wirings are connected to each other in a region in which a functional element is formed, high-density integration of the functional element may be achieved by reducing a size of an electrode terminal.

However, if the size of the electrode terminal is reduced, it is necessary to perform positioning between the circuit substrate and the electronic component with high accuracy during wiring connection. In other words, in a case where positioning accuracy between the substrate and the circuit substrate is not sufficient, there is concern that appropriate wiring connection may not be performed due to positional deviation between the electrode terminal and the bump electrode. As mentioned above, in the configuration of the related art, there is concern that the reliability of electrical connection between substrates in a region in which a functional element is formed may be reduced.

SUMMARY

An advantage of some aspects of the invention is to provide a mounting structure, an ultrasonic device, an ultrasonic probe, an ultrasonic apparatus, an electronic apparatus, and a manufacturing method of the mounting structure as application examples and embodiments capable of improving the reliability of electrical connection between substrates.

A mounting structure according to an application example of the invention includes a first substrate which has a first surface on which a functional element is provided; a second substrate that has a second surface facing the first surface; a wiring portion that is provided at a position which is different from a position of the functional element on the first surface, has a third surface facing the second surface, and is electrically connected to the functional element; and a conduction portion that is provided on the second surface, protrudes toward the first surface, and is connected to the third surface so as to be electrically connected to the functional element, in which an area of the third surface is larger than an area of a first end section of the wiring portion on the first substrate side in a plan view which is viewed from a thickness direction of the first substrate and the second substrate.

In the application example, the functional element and the wiring portion which is electrically connected to the functional element are provided on the first surface of the first substrate. The conduction portion connected to the wiring portion is provided on the second surface of the second substrate. An area of the third surface of the wiring portion is larger than an area of the first end section of the wiring portion on the first substrate side in a plan view in the thickness direction. In this configuration, it is possible to increase the area of the third surface connected to the conduction portion without changing the area of the first end section in the plan view. Therefore, it is possible to increase an allowable amount of positional deviation between the first substrate and the second substrate and thus to improve connection reliability. It is possible to achieve high-density integration of the functional element without changing the area of the first end section in the plan view.

In the mounting structure according to the application example, it is preferable that a second end section of the wiring portion on the second substrate side protrudes along the first surface.

In the application example with this configuration, the second end section of the wiring portion protrudes along the first surface. In this configuration, it is possible to suppress an increase in a sectional area (an area of a section which is parallel to the first surface and the second surface) of the wiring portion on the first end section side while increasing an area of the third surface of the wiring portion. Therefore, it is possible to achieve high-density integration of the functional element and also to improve connection reliability.

In the mounting structure according to the application example, it is preferable that the wiring portion has a side surface ranging between the first end section and the second end section, and the side surface has a depressed surface which is depressed in a direction of becoming distant from the functional element on a side on which the functional element is disposed.

The wiring portion of the application example with this configuration has the depressed surface which is depressed in a direction of becoming distant from the functional element as the side surface on the side on which the functional element is disposed. In other words, when the wiring portion is cut in a plane which passes through positions (central positions) where the wiring portion and the functional element are disposed and which are along the substrate thickness direction, the side surface thereof is curved to be depressed toward the center side of the wiring portion. Consequently, the side surface of the wiring portion can be separated from the functional element compared with a configuration in which the side surface protrudes toward the functional element, or a configuration in which the side surface is linear. Therefore, it is possible to further prevent interference between the functional element and the wiring portion.

In the mounting structure according to the application example, it is preferable that the third surface has a projection protruding toward the second surface side.

In the application example with this configuration, the third surface of the wiring portion has a projection on the second surface side, that is, a projection surface projecting toward the second surface side. An area of the third surface is increased, for example, compared with a case where the third surface is flat. Therefore, since the conduction portion is in close contact with and along the third surface, a connection area can be increased, and thus it is possible to reduce contact resistance (electric resistance).

In the mounting structure according to the application example, it is preferable that the third surface has a depression which is depressed toward the first surface side.

In the application example with this configuration, the third surface of the wiring portion has a depression which is depressed toward the first surface side, that is, a depressed surface depressed toward the first surface side. In this configuration, even if positional deviation of the conduction portion occurs with respect to the third surface during wiring connection, the conduction portion can be moved to a predetermined position such as the deepest portion of the curved surface (for example, a portion closest to the first substrate) along the curved surface. Therefore, it is possible to improve the accuracy of positioning between the first substrate and the second substrate.

In the mounting structure according to the application example, it is preferable that the conduction portion has a protrusion protruding toward the first surface side.

In the application example with this configuration, the conduction portion has a protrusion protruding toward the first surface side, that is, a projection surface projecting toward the first surface side. In this configuration, during wiring connection, at least a part of the protrusion on the conduction portion side is inserted into the depression on the wiring port ion side, and thus the first substrate and the second substrate can be positioned. Therefore, positioning between the first substrate and the second substrate is facilitated. The accuracy of positioning can be improved.

In the mounting structure according to the application example, it is preferable that the depression includes a spherical depression section which is curved at a first curvature, the protrusion includes a spherical projection section which is curved at a second curvature, and the first curvature is equal to or less than the second curvature.

In the application example with this configuration, the depression includes the spherical depression section having the first curvature. The protrusion includes the spherical projection section having the second curvature. The first curvature is equal to or less than the second curvature. In this configuration, the protrusion can be moved along the depression having the curvature which is equal to or less than the curvature of the protrusion. Therefore, even if positional deviation occurs between the wiring portion and the conduction portion as described above, the conduction portion can be moved more reliably along the depression of the wiring portion, and thus positioning accuracy can be improved.

In the mounting structure according to the application example, it is preferable that the depression includes a spherical depression section which is curved at a first curvature, the protrusion includes a spherical projection section which is curved at a second curvature, and the first curvature is more than the second curvature.

In the application example with this configuration, the depression includes the spherical depression section having the first curvature. The protrusion includes the spherical projection section having the second curvature. The first curvature is more than the second curvature. In this configuration, the projection and the depression can be relatively moved according to the curvature of the protrusion so that central positions of the protrusion and the depression in a surface intersecting the substrate thickness direction match each other. Positioning between the first substrate and the second substrate is facilitated. Positioning accuracy can be improved.

In the mounting structure according to the application example, it is preferable that the conduction portion has a fourth surface connected to the third surface, and at least one of the third surface and the fourth surface has a sliding preventing section preventing sliding between the third surface and the fourth surface.

In the application example with this configuration, at least one of the third surface and the fourth surface has a sliding preventing section preventing sliding between the third surface and the fourth surface. In this configuration, sliding between the third surface and the fourth surface can be prevented during wiring connection, and thus it is possible to prevent a reduction in positioning accuracy due to sliding.

In the mounting structure according to the application example, it is preferable that the sliding preventing section has irregularities.

In the application example with this configuration, irregularities are provided as the sliding preventing section. In this configuration, it is possible to prevent a reduction in positioning accuracy due to sliding between the third surface and the fourth surface with a simple configuration in which the irregularities are provided on at least one of the third surface and the fourth surface.

A mounting structure according to an application example includes a first substrate which has a first surface on which a functional element is provided; a second substrate that has a second surface facing the first surface; a wiring portion that is provided at a position which is different from a position of the functional element on the first surface, and is electrically connected to the functional element; and a conduction portion that is provided on the second surface, protrudes toward the first surface, and is connected to the wiring portion so as to be electrically connected to the functional element, in which the wiring portion has a third surface facing the second surface, in which the conduction portion has a fourth surface connected to the third surface, and in which at least one of the third surface and the fourth surface has a sliding preventing section preventing sliding between the third surface and the fourth surface.

In the application example, the functional element and the wiring portion which is electrically connected to the functional element are provided on the first surface of the first substrate. The conduction portion connected to the wiring portion is provided on the second surface of the second substrate. At least one of the third surface of the wiring portion and the fourth surface of the conduction portion connected to each other has the sliding preventing section. In this configuration, sliding between the third surface and the fourth surface can be prevented during wiring connection, and thus it is possible to prevent a reduction in positioning accuracy due to sliding.

Since it is possible to prevent a reduction in positioning accuracy, it is possible to prevent interference between the conduction portion and the functional element due to positional deviation between the first substrate and the second substrate. Since it is possible to prevent a reduction in positioning accuracy, it is possible to achieve high-density integration of the functional element.

In the mounting structure according to the application example, it is preferable that the conduction portion includes a resin section and a conductive film covering the resin section.

In the application example with this configuration, the conduction portion includes the resin section and the conductive film covering the resin section. In this configuration, the conduction portion can be elastically deformed by the resin section and the conductive film. Therefore, it is possible to improve close contact between the conduction portion and the wiring portion and thus to improve connection reliability during wiring connection.

An ultrasonic device according to an application example of the invention includes a first substrate which has a first surface on which a vibrator is provided; a second substrate that has a second surface facing the first surface; a wiring portion that is provided at a position which is different from a position of the vibrator on the first surface, has a third surface facing the second surface, and is electrically connected to the vibrator; and a conduction portion that is provided on the second surface, protrudes toward the first surface, and is connected to the third surface so as to be electrically connected to the vibrator, in which an area of the third surface is larger than an area of a first end section of the wiring portion on the first substrate side in a plan view which is viewed from a thickness direction of the first substrate and the second substrate.

In the application example, the vibrator and the wiring portion which is electrically connected to the vibrator are provided on the first surface of the first substrate. The conduction portion connected to the wiring portion is provided on the second surface of the second substrate. An area of the third surface of the wiring portion is larger than an area of the first end section of the wiring portion on the first substrate side in a plan view in the thickness direction.

In this configuration, in the same manner as in the application example, it is possible to increase an allowable amount of positional deviation between the first substrate and the second substrate and thus to improve connection reliability, compared with a case where the conduction portion is connected to an electrode terminal formed on the first surface of the first substrate.

In the same manner as in the application example, it is possible to achieve high-density integration of the vibrator by reducing an area on the first end section side.

An ultrasonic probe according to an application example of the invention includes a first substrate which has a first surface on which a vibrator is provided; a second substrate that has a second surface facing the first surface; a wiring portion that is provided at a position which is different from a position of the vibrator on the first surface, has a third surface facing the second surface, and is electrically connected to the vibrator; a conduction portion that is provided on the second surface, protrudes toward the first surface, and is connected to the third surface so as to be electrically connected to the vibrator; and a casing that stores the first substrate, the wiring portion, the second substrate, and the conduction portion, in which an area of the third surface is larger than an area of a first end section of the wiring portion on the first substrate side in a plan view which is viewed from a thickness direction of the first substrate and the second substrate.

In the application example, the vibrator and the wiring portion which is electrically connected to the vibrator are provided on the first surface of the first substrate. The conduction portion connected to the wiring portion is provided on the second surface of the second substrate. An area of the third surface of the wiring portion is larger than an area of the first end section of the wiring portion on the first substrate side in a plan view in the thickness direction.

In this configuration, in the same manner as in the application example, it is possible to increase an allowable amount of positional deviation between the first substrate and the second substrate and thus to improve connection reliability, compared with a case where the conduction portion is connected to an electrode terminal formed on the first surface of the first substrate.

In the same manner as in the application example, it is possible to achieve high-density integration of the vibrator by reducing an area on the first end section side.

An ultrasonic apparatus according to an application example of the invention includes a first substrate which has a first surface on which a vibrator is provided; a second substrate that has a second surface facing the first surface; a wiring portion that is provided at a position which is different from a position of the vibrator on the first surface, has a third surface facing the second surface, and is electrically connected to the vibrator; a conduction portion that is provided on the second surface, protrudes toward the first surface, and is connected to the third surface so as to be electrically connected to the vibrator; and a control unit that controls the vibrator, in which an area of the third surface is larger than an area of a first end section of the wiring portion on the first substrate side in a plan view which is viewed from a thickness direction of the first substrate and the second substrate.

In the application example, the vibrator and the wiring portion which is electrically connected to the vibrator are provided on the first surface of the first substrate. The conduction portion connected to the wiring portion is provided on the second surface of the second substrate. An area of the third surface of the wiring portion is larger than an area of the first end section of the wiring portion on the first substrate side in a plan view in the thickness direction.

In this configuration, in the same manner as in the application example, it is possible to increase an allowable amount of positional deviation between the first substrate and the second substrate and thus to improve connection reliability, compared with a case where the conduction portion is connected to an electrode terminal formed on the first surface of the first substrate.

In the same manner as in the application example, it is possible to achieve high-density integration of the vibrator by reducing an area on the first end section side.

An electronic apparatus according to an application example of the invention includes a first substrate which has a first surface on which a functional element is provided; a second substrate that has a second surface facing the first surface; a wiring portion that is provided at a position which is different from a position of the functional element on the first surface, has a third surface facing the second surface, and is electrically connected to the functional element; a conduction portion that is provided on the second surface, protrudes toward the first surface, and is connected to the third surface so as to be electrically connected to the functional element; and a control unit that controls the functional element, in which an area of the third surface is larger than an area of a first end section of the wiring portion on the first substrate side in a plan view which is viewed from a thickness direction of the first substrate and the second substrate.

In the application example, the functional element and the wiring portion which is electrically connected to the functional element are provided on the first surface of the first substrate. The conduction portion connected to the wiring portion is provided on the second surface of the second substrate. An area of the third surface of the wiring portion is larger than an area of the first end section of the wiring portion on the first substrate side in a plan view in the thickness direction.

In this configuration, in the same manner as in the application example, it is possible to increase an allowable amount of positional deviation between the first substrate and the second substrate and thus to improve connection reliability, compared with a case where the conduction portion is connected to an electrode terminal formed on the first surface of the first substrate.

In the same manner as in the application example, it is possible to achieve high-density integration of the functional element by reducing an area on the first end section side.

A manufacturing method of a mounting structure according to an application example includes a first substrate which has a first surface on which a functional element is provided, a second substrate that has a second surface facing the first surface, a wiring portion that is provided at a position which is different from a position of the functional element on the first surface, has a third surface facing the second surface, and is electrically connected to the functional element, and a conduction portion that is provided on the second surface, protrudes toward the first surface, and is connected to the third surface so as to be electrically connected to the functional element, the method including forming the wiring portion in which an area of the third surface is larger than an area of an end section on the first substrate side in a plan view which is viewed from a thickness direction of the first substrate and the second substrate; forming the conduction portion on the second substrate; and connecting the wiring portion to the conduction portion.

In the application example, the functional element and the wiring portion which is electrically connected to the functional element are provided on the first surface of the first substrate. The conduction portion connected to the wiring portion is provided on the second surface of the second substrate. An area of the third surface of the wiring portion is larger than an area of the first end section of the wiring portion on the first substrate side in a plan view in the thickness direction.

In this configuration, in the same manner as in the application example, it is possible to increase an allowable amount of positional deviation between the first substrate and the second substrate and thus to improve connection reliability, compared with a case where the conduction portion is connected to an electrode terminal formed on the first surface of the first substrate.

In the same manner as in the application example, it is possible to achieve high-density integration of the functional element by reducing an area on the first end section side.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a description will be made of an ultrasonic measurement apparatus according to a first embodiment with reference to the drawings.

Figure 1:
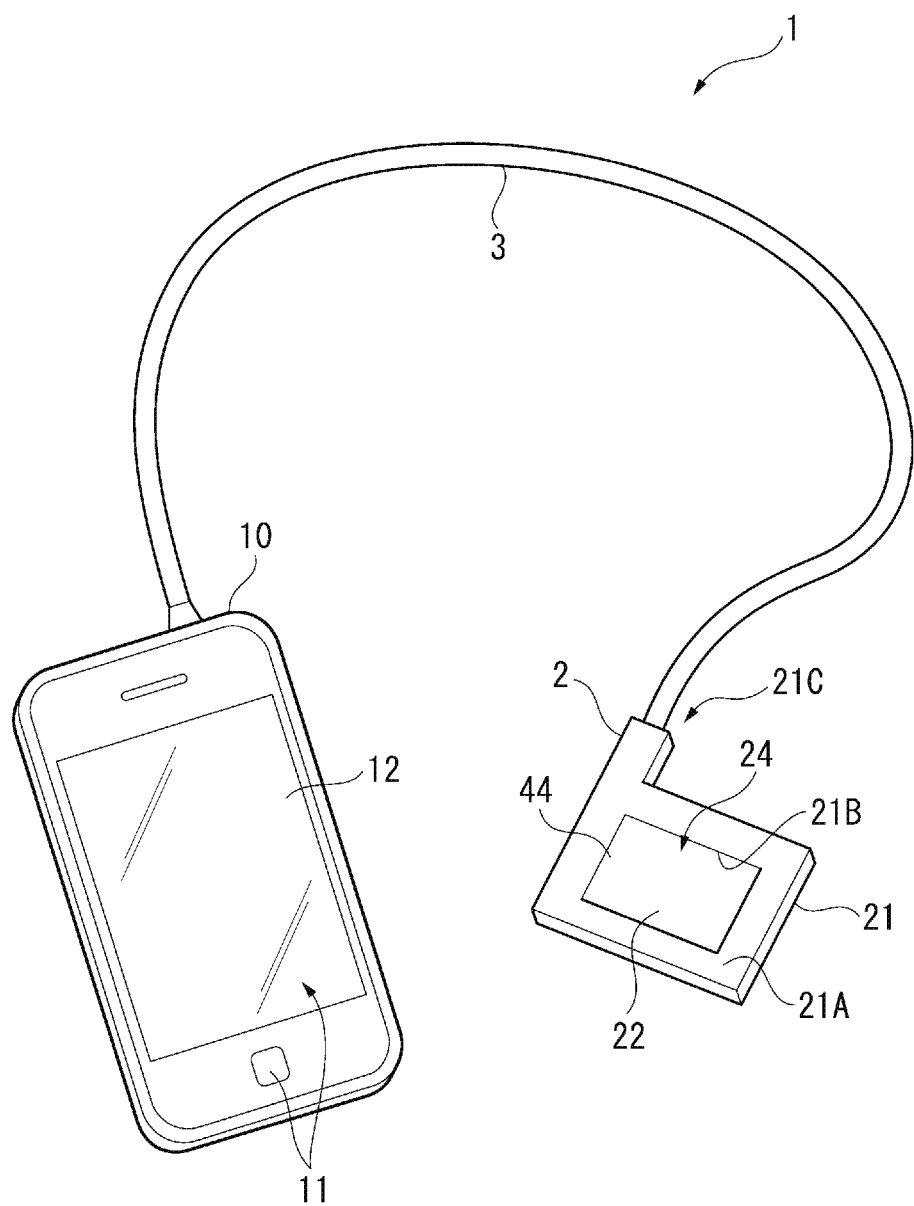
FIG. 1 is a perspective view illustrating a schematic configuration of an ultrasonic apparatus according to a first embodiment.
Figure 2:
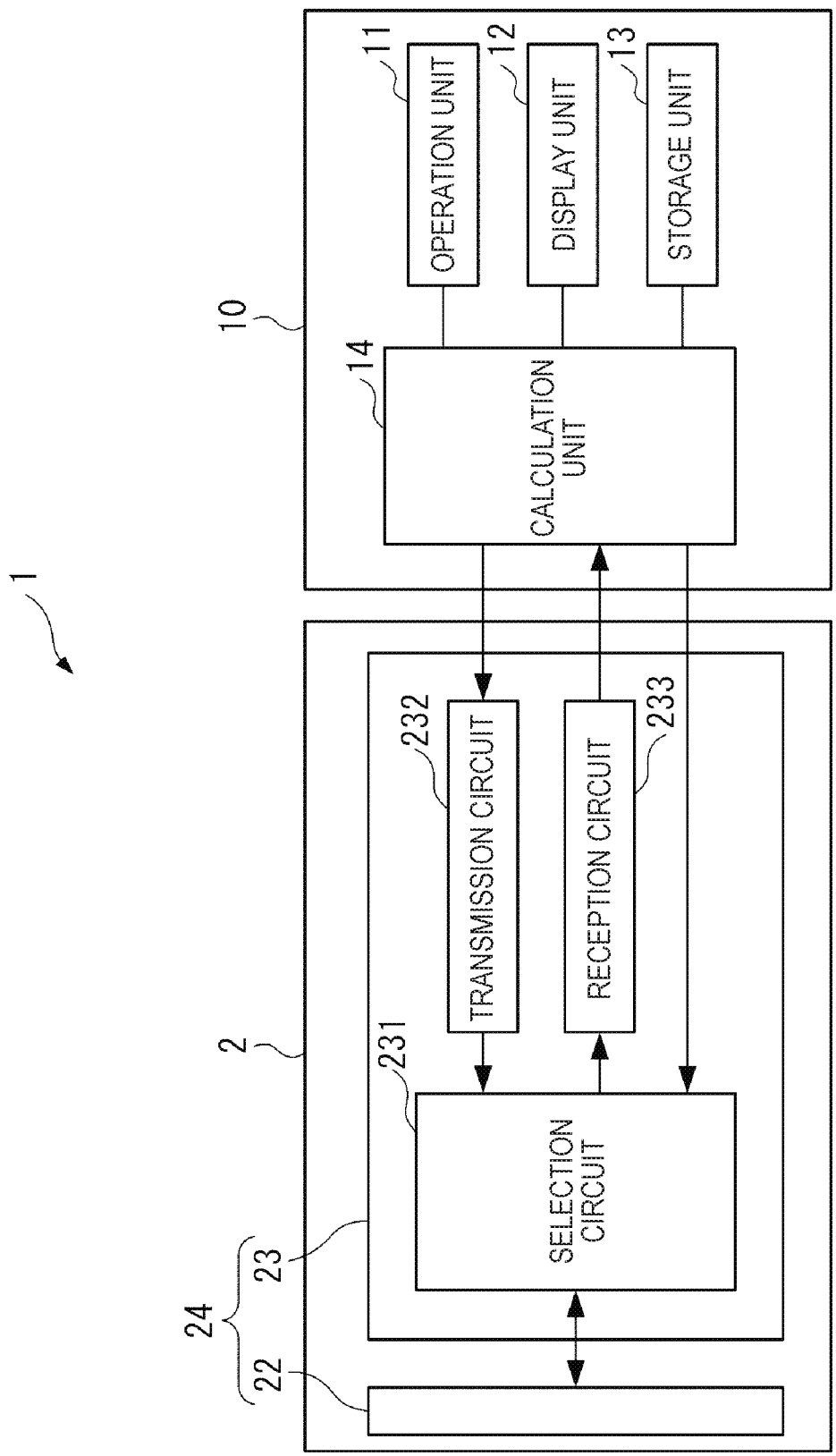
FIG. 2 is a block diagram illustrating a schematic configuration of the ultrasonic apparatus according to the first embodiment.

FIG. 1 is a perspective view illustrating a schematic configuration of an ultrasonic measurement apparatus 1. FIG. 2 is a block diagram illustrating a schematic configuration of the ultrasonic measurement apparatus 1.

As illustrated in FIG. 1, the ultrasonic measurement apparatus 1 includes an ultrasonic probe 2, and a control device 10 which is electrically connected to the ultrasonic probe 2 via a cable 3.

In the ultrasonic measurement apparatus 1, the ultrasonic probe 2 is brought into close contact with a surface of a living body (for example, a human body), and ultrasonic waves are transmitted into the living body from the ultrasonic probe 2. Ultrasonic waves reflected at an organ of the living body are received by the ultrasonic probe 2, and, for example, an internal tomographic image of the living body is acquired, or a state (for example, a blood flow) of an organ of the living body is measured, on the basis of received signals.

Configuration of Control Device

The control device 10 corresponds to a control unit, and is configured to include, for example, an operation unit 11, a display unit 12, a storage unit 13, and a calculation unit 14, as illustrated in FIG. 2. The control device 10 may employ, for example, a terminal device such as a tablet terminal, a smart phone, or a personal computer, and may be a dedicated terminal device for operating the ultrasonic probe 2.

The operation unit 11 is a user interface (UI) for a user operating the ultrasonic measurement apparatus 1, and may be formed of, for example, a touch panel provided on the display unit 12, operation buttons, a keyboard, and a mouse.

The display unit 12 is formed of, for example, a liquid crystal display, and displays an image.

The storage unit 13 stores various programs or various pieces of data for controlling the ultrasonic measurement apparatus 1.

The calculation unit 14 is formed of, for example, a calculation circuit such as a central processing unit (CPU) and a storage circuit such as a memory. The calculation unit 14 reads various programs stored in the storage unit 13 and executes the programs so as to perform control for processes of generating and outputting a transmission signal for causing the ultrasonic probe 2 to transmit ultrasonic waves; and to perform control for various processes (for example, setting of a frequency of a reception signal or gain setting) of causing the ultrasonic probe 2 to receive ultrasonic waves.

Configuration of Ultrasonic Probe

The ultrasonic probe 2 includes a casing 21, an ultrasonic device 22 stored in the casing 21, and a circuit substrate 23 provided with a driver circuit and the like for controlling the ultrasonic device 22 (refer to FIG. 2). An ultrasonic sensor 24 is formed of the ultrasonic device 22 and the circuit substrate 23, and the ultrasonic sensor 24 forms an ultrasonic module.

Configuration of Casing

As illustrated in FIG. 1, the casing 21 is formed, for example, in a rectangular box shape in a plan view, and a sensor window 21B is provided on one surface (sensor surface 21A) which is orthogonal to a thickness direction, and a part of the ultrasonic device 22 is exposed. A passing hole 21C of the cable 3 is provided at a part of the casing 21 (a side surface in the example illustrated in FIG. 1), and the cable 3 is connected to the circuit substrate 23 inside the casing 21 through the passing hole 21C. A gap between the cable 3 and the passing hole 21C is filled with, for example, a resin material, and thus water resistance is ensured.

In the present embodiment, a configuration example in which the ultrasonic probe 2 and the control device 10 are connected to each other via the cable 3 is described, but, for example, the ultrasonic probe 2 and the control device 10 may be connected to each other through wireless communication, and various constituent elements of the control device 10 may be provided in the ultrasonic probe 2.

Configuration of Circuit Substrate

The circuit substrate 23 is provided with a driver circuit or the like which is bonded to the ultrasonic device 22 so as to control the ultrasonic device 22. As illustrated in FIG. 2, the circuit substrate 23 includes a selection circuit 231, a transmission circuit 232, and a reception circuit 233.

The selection circuit 231 switches between connection states such as transmission connection for connecting the ultrasonic device 22 to the transmission circuit 232 and reception connection for connecting the ultrasonic device 22 to the reception circuit 233 under the control of the control device 10.

The transmission circuit 232 outputs a transmission signal for transmitting ultrasonic waves to the ultrasonic device 22 via the selection circuit 231 when a connection state is switched to the transmission connection under the control of the control device 10.

The reception circuit 233 outputs a received signal which is input from the ultrasonic device 22 via the selection circuit 231, to the control device 10 when a connection state is switched to the reception connection under the control of the control device 10. The reception circuit 233 is configured to include, for example, a low-noise amplification circuit, a voltage controlled alternator, a programmable gain amplifier, a low-pass filter, and an A/D converter, performs various signal processes such as conversion of the received signal into a digital signal, removal of a noise component, and amplification to a desired signal level, and then outputs the processed received signal to the control device 10.

Configuration of Ultrasonic Device

Figure 3:
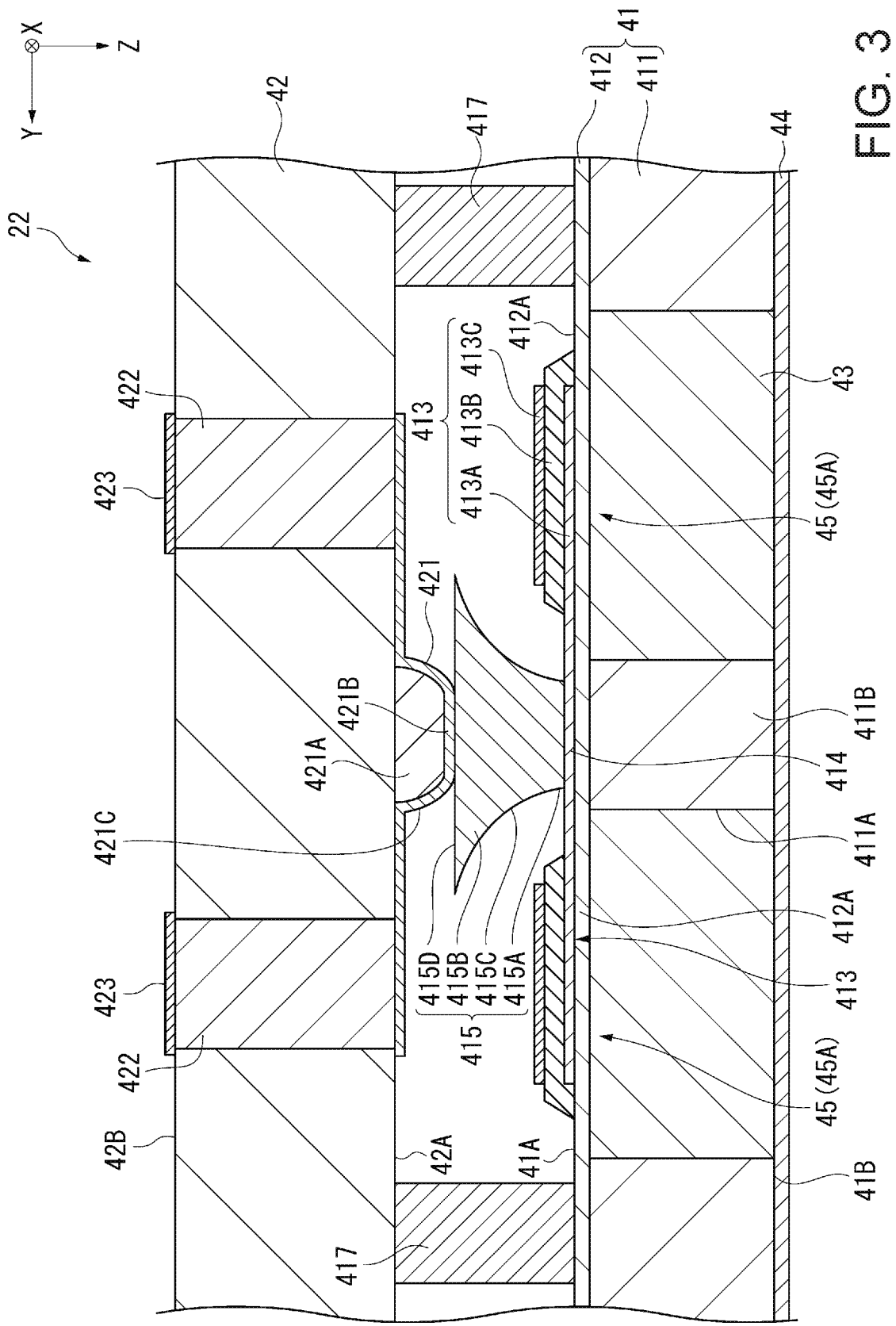
FIG. 3 is a sectional view illustrating a schematic configuration of an ultrasonic device according to the first embodiment.
Figure 4:
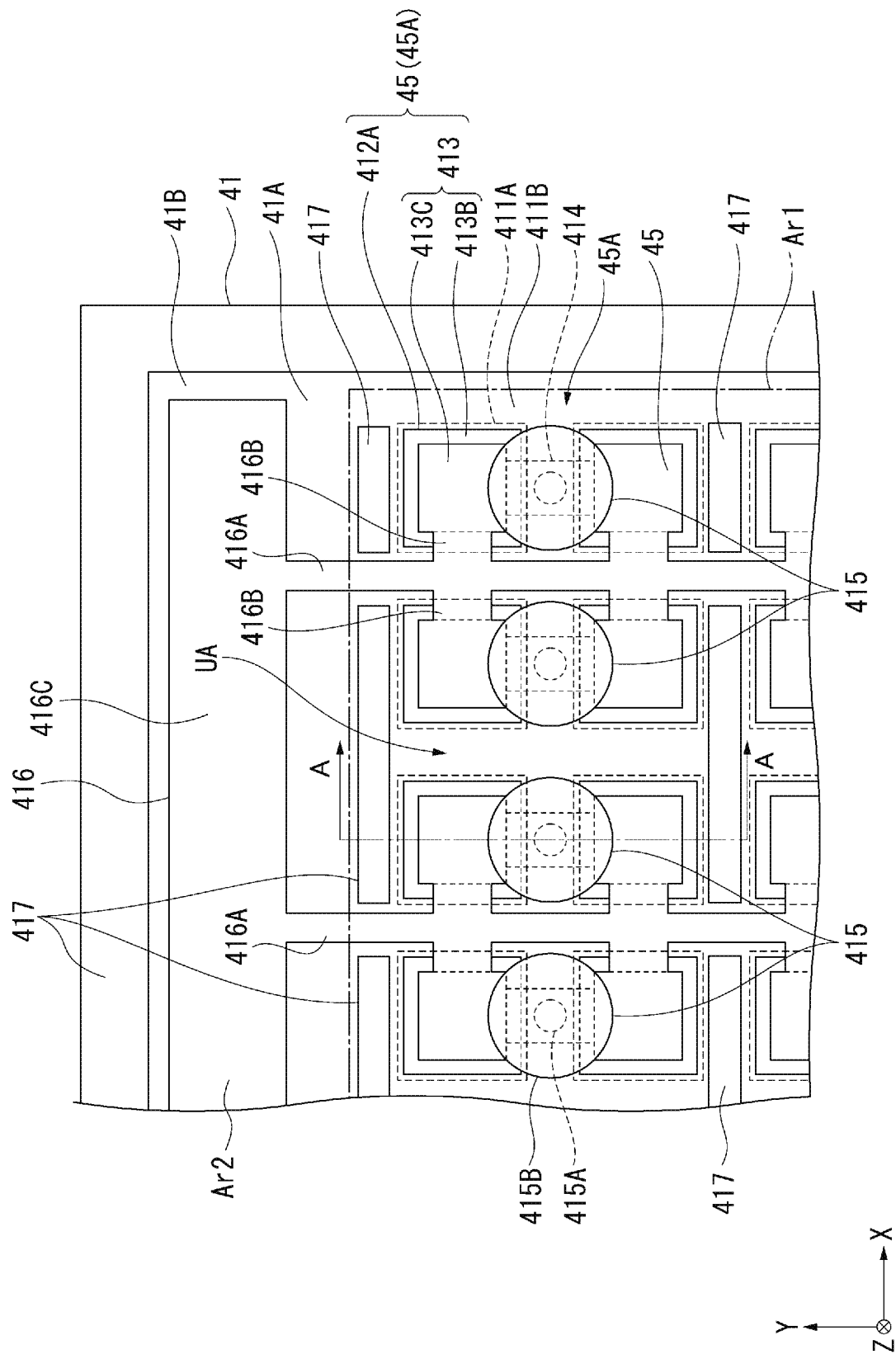
FIG. 4 is a plan view illustrating a schematic configuration of an element substrate in the ultrasonic device according to the first embodiment.
Figure 5:
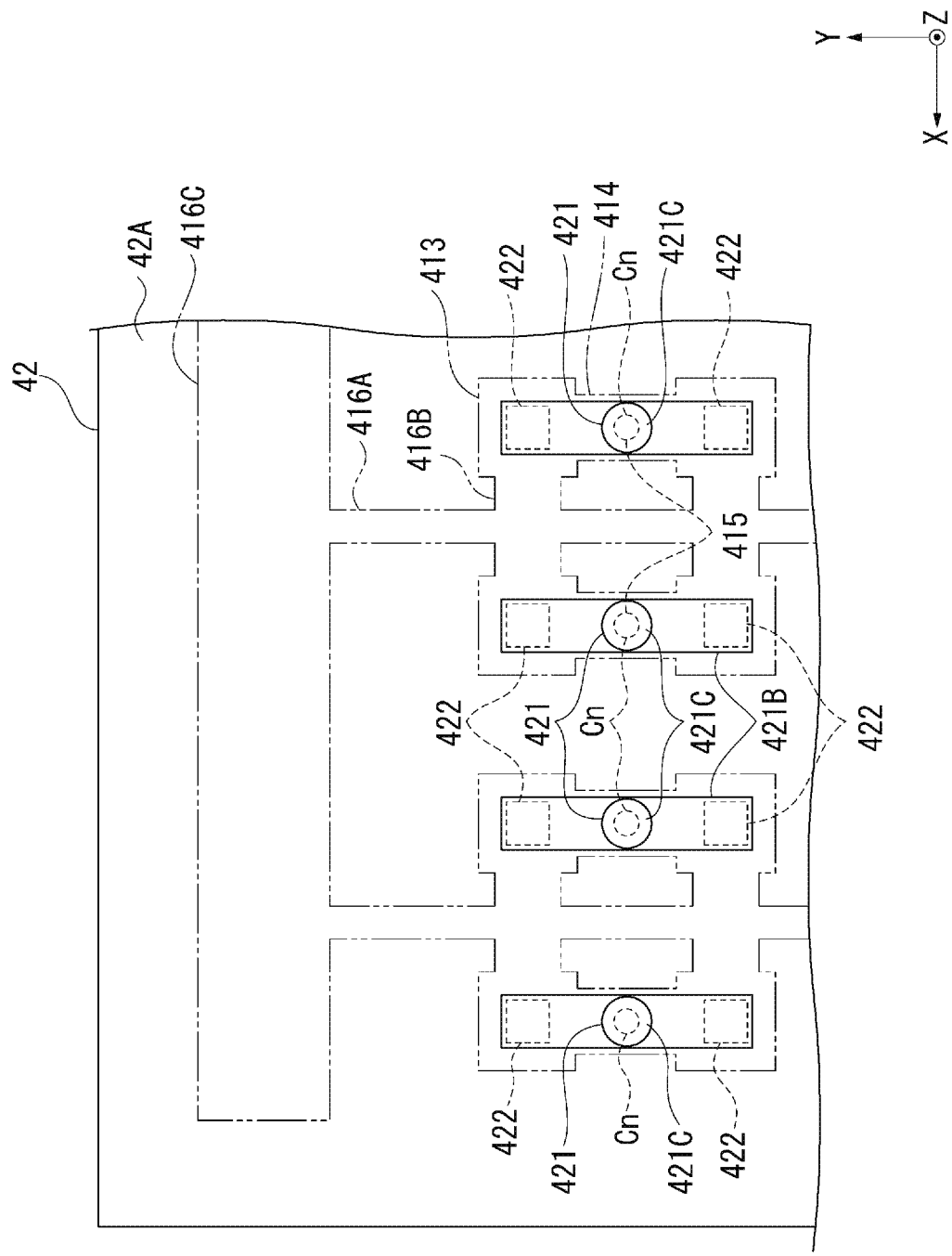
FIG. 5 is a plan view illustrating a schematic configuration of a sealing plate in the ultrasonic device according to the first embodiment.

FIG. 3 is a sectional view of the ultrasonic device 22. FIG. 4 is a plan view in which an element substrate 41 of the ultrasonic device 22 is viewed from a sealing plate 42 side. FIG. 5 is a plan view schematically illustrating an ultrasonic transducer 45 viewed from a protection film 44 side. FIG. 3 is a sectional view of the ultrasonic device 22 taken along the line A-A in FIG. 4.

As illustrated in FIG. 3, the ultrasonic device 22 is configured to include the element substrate 41, the sealing plate 42, an acoustic matching layer 43, and the protection film 44. Above all, as illustrated in FIG. 3, the element substrate 41 and the sealing plate 42 are electrically connected to each other via a conduction portion 421 provided on the sealing plate 42 side.

As illustrated in FIG. 4, the element substrate 41 is provided with a plurality of ultrasonic transducers 45 which transmit and receive ultrasonic waves are disposed in a matrix along an X axis and a Y direction intersecting (in the present embodiment, orthogonal to) the X axis. An ultrasonic array UA is formed of the plurality of ultrasonic transducers 45.

Configuration of Element Substrate

The element substrate 41 corresponds to a first substrate, and includes, as illustrated in FIG. 3, a substrate main body portion 411, and a vibration film 412 laminated on the substrate main body portion 411. As illustrated in FIG. 4, the element substrate 41 is provided with piezoelectric elements 413, a lower electrode connection line 414, a wiring portion 415, an upper electrode extraction line 416, and bonding portions 417 on the vibration film 412 on the sealing plate 42 side. The ultrasonic transducer 45 which transmits and receives an ultrasonic wave is formed of a flexible film 412A and the piezoelectric element 413 in a vibration region of the vibration film 412 among the constituent elements. The element substrate 41 has an array region Ar1 in which the ultrasonic array UA formed of the plurality of ultrasonic transducers 45 is provided.

Here, in the following description, a surface of the element substrate 41 facing the sealing plate 42 will be referred to as a rear surface 41A corresponding to a first surface, and a surface opposite to the rear surface 41A will be referred to as an operation surface 41B. A normal direction to the operation surface 41B is substantially the same as the Z direction (a thickness direction of the element substrate 41), and a direction from the element substrate 41 toward the sealing plate 42 is substantially parallel to the Z direction.

The substrate main body portion 411 is, for example, a semiconductor substrate such as Si. An opening 411A corresponding to each ultrasonic transducer 45 is provided in an array region Ar1 in the substrate main body portion 411. The respective openings 411A are separated by a wall portion 411B (refer to FIG. 3). Each opening 411A is closed by the vibration film 412 provided on the sealing plate 42 side (−Z side).

The vibration film 412 is formed of, for example, $SiO_2$, or a laminate of $SiO_2$ and $ZrO_2$, and is provided to cover the entire −Z side of the substrate main body portion 411. In the vibration film 412, a portion closing the opening 411A forms the flexible film 412A which is elastically deformed. A thickness dimension (thickness) of the vibration film 412 is a sufficiently small thickness dimension (thickness) relative to the substrate main body portion 411. In a case where the substrate main body portion 411 is made of Si, and the vibration film 412 is made of $SiO_2$, for example, the substrate main body portion 411 is subject to oxidation treatment, and thus the vibration film 412 having a desired thickness dimension (thickness) can be easily formed. In this case, the substrate main body portion 411 is etched with the vibration film 412 of $SiO_2$ as an etching stopper, and thus the opening 411A can be easily formed.

Each piezoelectric element 413 is provided on the flexible film 412A of the vibration film 412 closing each opening 411A. A single ultrasonic transducer 45 is formed of the flexible film 412A and the piezoelectric element 413. The piezoelectric element 413 is formed of a laminate of a lower electrode 413A, a piezoelectric film 413B, and an upper electrode 413C.

The lower electrode 413A or the upper electrode 413C is configured to include a layer made of one or two or more conductive materials. As such a conductive material, for example, electrode materials such as Au, Al, Cu, Ir, Pt, IrOx, Ti, TiW, and TiOx may be used. In the present embodiment, for example, the lower electrode 413A is formed by laminating a TiW layer (50 nm) and a Cu layer (100 nm) in this order on the vibration film 412.

The piezoelectric film 413B is formed by using, for example, a transition metal oxide having a perovskite structure, more specifically, lead zirconate titanate containing Pb, Ti, and Zr.

A rectangular wave voltage with a predetermined frequency is applied between the lower electrode 413A and the upper electrode 413C in the ultrasonic transducer 45, and thus an ultrasonic wave can be transmitted by causing the flexible film 412A located in the opening region of the opening 411A to vibrate along the Z direction. If the flexible film 412A vibrates due to a reflected ultrasonic wave from a target object, a potential difference occurs in the upper and lower portions of the piezoelectric film 413B. Therefore, the received ultrasonic wave can be detected by detecting the potential difference occurring between the lower electrode 413A and the upper electrode 413C.

In the present embodiment, as illustrated in FIG. 4, among the plurality of ultrasonic transducers 45 disposed along the X direction and the Y direction, two ultrasonic transducers 45 arranged in the Y direction form an ultrasonic transducer group 45A which is a single transmission/reception channel. In other words, the ultrasonic array UA has a two-dimensional array structure in which the ultrasonic transducer groups 45A are disposed along the X direction and the Y direction. That is, the ultrasonic array UA is a two-dimensional array formed by arranging a plurality of transmission/reception channels along the X direction and the Y direction.

The lower electrodes 413A of the respective ultrasonic transducers 45 forming the ultrasonic transducer groups 45A are connected to each other via the lower electrode connection line 414. The lower electrode connection line 414 is integrally formed with each lower electrode 413A. In other words, the lower electrode connection line 414 is formed by laminating a TiW layer (50 nm) and a Cu layer (100 nm) in the same manner as, for example, the lower electrode 413A. The lower electrode connection line 414 may be provided separately from the lower electrode 413A.

The upper electrode extraction line 416 is connected to each upper electrode 413C of the ultrasonic transducer 45. The upper electrode extraction line 416 is made of a conductive material, and includes a plurality of extraction portions 416A disposed along the Y direction, connection portions 416B connecting the extraction port ions 416A to the upper electrodes 413C, and a connection terminal portion 416C disposed in a wiring region Ar2.

As illustrated in FIG. 4, for example, each of the extraction portions 416A is disposed between the odd-numbered and even-numbered ultrasonic transducer groups 45A, when counted along the X direction, and is connected to the upper electrode 413C of each ultrasonic transducer group 45A via the connection portion 416B.

The connection terminal portion 416C is formed in the wiring region Ar2 of the outer peripheral portion of the element substrate 41, and is connected to the extraction portions 416A. The connection terminal portion 416C is connected to a ground circuit (not illustrated) of the circuit substrate 23 via a wiring member, and is set to a reference potential (for example, 0 potential). In other words, the upper electrode 413C is a common electrode to which a reference potential is applied.

The bonding portion 417 bonds the element substrate 41 to the sealing plate 42 configured as described above. The bonding portions 417 are disposed at positions along the outer edge of the element substrate 41 or positions along the ultrasonic transducers 45. For example, as illustrated in FIG.

4, the bonding portions 417 are disposed at positions overlapping the wall portions 411B of the rear surface 41A along the X direction.

The bonding portion 417 is formed by using a material which can bond the element substrate 41 to the sealing plate 42, for example, various adhesives or a resin material such as a photosensitive resin material (photoresist). In the present embodiment, the bonding portion 417 is formed by using a photosensitive resin material. Consequently, the bonding portion 417 can be formed at a desired position in a desired shape.

Configuration of Wiring Portion

The wiring portion 415, which has conductivity, is disposed at a position which is different from that of the ultrasonic transducer 45 of the rear surface 41A, and is electrically connected to the ultrasonic transducer 45 via the lower electrode connection line 414. Specifically, the wiring portion 415 protrudes toward the sealing plate 42 from the lower electrode connection line 414 disposed at a position overlapping the wall portion 411B in a plan view viewed from the Z direction, and is electrically connected to the conduction portion 421 which will be described later. In other words, the lower electrode 413A of each ultrasonic transducer 45 is electrically connected to the conduction portion 421 via the lower electrode connection line 414 and the wiring portion 415. A single wiring portion 415 is provided in each of the plurality of ultrasonic transducer groups 45A. A mounting structure is configured to include at least the element substrate 41, the wiring portion 415, the sealing plate 42, and the conduction portion 421.

The wiring portion 415 has a first end section 415A on the element substrate 41 side, a second end section 415B on the sealing plate 42 side, a side surface 415C, and a contact surface 415D (corresponding to a third surface) on the sealing plate 42 side.

The second end section 415B protrudes along the sealing plate 42, and has larger dimensions (area) in the X direction and the Y direction than those of the first end section 415A. In other words, in the wiring portion 415, the second end section 415B protrudes in the X direction and the Y direction compared with the first end section 415A. At least a part of the second end section 415B overlaps the ultrasonic transducer 45 in the Z direction as illustrated in FIGS. 3 and 4.

The side surface 415C is a surface from a basal end section of the wiring portion 415 on the element substrate 41 side to the contact surface 415D. The side surface 415C is a curved surface which is curved in a depressed state toward the center of the wiring portion 415 in a direction which is orthogonal to the Z direction. In other words, a sectional area of a plane which is parallel to an XY plane of the side surface 415C increases, and an increase amount of the sectional area also increases, from the first end section 415A toward the second end section 415B. In other words, the side surface 415C is curved in a direction of becoming distant from the piezoelectric element 413. In this configuration, even in a case where the vibration film 412 vibrates, interference between the wiring portion 415 (side surface 415C) and the piezoelectric element 413 is reduced.

The contact surface 415D has a larger area in a plan view from the Z direction than that of the conduction portion 421. In other words, a dimension of the contact surface 415D is larger than a dimension of the conduction portion 421 in the directions (for example, the X direction and the Y direction) which are orthogonal to the Z direction.

The wiring portion 415 is formed by using, for example, a conductive material such as a metal material, or a resin material containing conductive fillers. For example, the wiring portion 415 is formed by depositing a metal material on the lower electrode connection line 414 according to an electroplating method.

Configuration of Sealing Plate

The sealing plate 42 illustrated in FIGS. 3 to 5, which corresponds to a second substrate, is provided to reinforce the strength of the element substrate 41, and is formed of, for example, a semiconductor substrate. The sealing plate 42 is bonded to the element substrate 41 via the bonding portions 417. A material or a thickness of the sealing plate 42 influences frequency characteristics of the ultrasonic transducer 45, and is thus preferably set on the basis of a center frequency of transmitted and received ultrasonic waves.

The sealing plate 42 is provided with the conduction portion 421 and a through electrode 422.

Configuration of Conduction Portion

The conduction portion 421 illustrated in FIGS. 3 to 5 is provided on a surface (corresponding to a second surface, and, hereinafter, referred to as an inner surface 42A) of the sealing plate 42 on the element substrate 41 side, and is in close contact with the wiring portion 415 provided on the element substrate 41 so as to be electrically connected thereto. The conduction portion 421 includes a resin section 421A, and a conductive film 421B which covers the resin section 421A and is electrically connected to the through electrode 422.

The resin section 421A is provided on the inner surface 42A at a position overlapping the wiring portion 415 as illustrated in FIG. 3, and protrudes from the inner surface 42A toward the element substrate 41. The resin section 421A is made of an elastic resin material, and is formed in a substantially hemisphere shape by thermally melting a resin material disposed on the inner surface 42A as will be described later. The resin section 421A may be formed in a substantially trapezoidal shape (a state in which corners of a trapezoidal are rounded) according to the kind of resin material, or a temperature condition in thermal melting.

A photosensitive resin material (photoresist) may be used as a material forming the resin section 421A. In this case, the resin section 421A may be formed in a desired shape at a desired position. As a material forming the resin section 421A, not only a photosensitive resin material, but also various elastic resin materials, for example, polyimide resin, acrylic resin, phenol resin, epoxy resin, silicone resin, and modified polyimide resin may be used.

The conductive film 421B is made of a conductive material, and coats the resin section 421A. The conductive film 421B extends to a formation position of the through electrode 422 along the Y direction, and is connected to the through electrode 422. A thickness of the conductive film 421B is made sufficiently smaller than a thickness of the resin section 421A, and thus the conductive film 421B can be deformed according to elastic deformation of the resin section 421A.

As a conductive material forming the conductive film 421B, Au, Ag, TiW, Cu, Ni, Pd, Al, Cr, Ti, W, NiCr, or a lead-free solder may be used. In the present embodiment, for example, the conductive film 421B is formed by laminating a TiW layer (50 nm) and an Au layer (100 nm) in this order from the inner surface 42A side.

As illustrated in FIG. 3, a part of the surface 421C of the conduction portion 421 is in contact with the contact surface 415D. In other words, the resin section 421A and the conductive film 421B forming the conduction portion 421 are formed in, for example, a substantially hemisphere shape in a state in which the sealing plate 42 is not bonded to the element substrate 41. When the sealing plate 42 is bonded to the element substrate 41, the +Z side end section of the conduction portion 421 is brought into pressure contact with the contact surface 415D so that the conduction portion 421 is elastically deformed, and a connection region Cn (refer to FIG. 5) of the +Z side end section comes into close contact with (electrically connected to) the contact surface 415D. Consequently, the conductive film 421B is biased toward the wiring portion 415 side by the restoring force of the elastically deformed resin section 421A, and thus it is possible to improve the reliability of electrical connection between the conduction portion 421 and the wiring portion 415.

Configuration of Through Electrode

As illustrated in FIGS. 3 to 5, a pair of through electrodes 422 are provided at positions with the resin section 421A interposed therebetween along the Y direction, and is, for example, a Si through electrode (Through-silicon via: TSV), or a conductive material filling a through hole. A lower electrode wire 423 is individually formed with respect to each through electrode 422 on a −Z side surface (hereinafter, referred to as an outer surface 42B) of the sealing plate 42. The lower electrode wire 423 is connected to the through electrode 422, and is connected to the circuit substrate 23 via a wiring (not illustrated) formed along the outer surface 42B. At least one through electrode 422 may be formed with respect to a single conduction portion 421, and three or more through electrodes may be formed. A position where the through electrode 422 is disposed is not limited to the illustrated example, and may be formed on, for example, the +X side or −X side of the resin section 421A.

Configurations of Acoustic Matching Layer and Protection Film

The acoustic matching layer 43 is disposed on the element substrate 41 on the operation surface 41B side. In the present embodiment, the acoustic matching layer 43 fills the opening 411A formed on the operation surface 41B side.

The protection film 44 is provided on the element substrate 41 and the acoustic matching layer 43, so as to protect the element substrate 41 and the acoustic matching layer 43. As illustrated in FIG. 1, the protection film 44 is exposed to the outside from the sensor window 21B of the casing 21, and is brought into contact with a living body surface during ultrasonic measurement.

The acoustic matching layer 43 or the protection film 44 causes an ultrasonic wave transmitted from the ultrasonic transducer 45 to propagate through a living body which is a measurement target with high efficiency, and causes an ultrasonic wave reflected inside the living body to propagate through the ultrasonic transducer 45 with high efficiency. Thus, acoustic impedance of the acoustic matching layer 43 and the protection film 44 is set to a value similar to acoustic impedance of the living body.

Manufacturing Method of Ultrasonic Device

Hereinafter, a description will be made of a manufacturing method of the above-described ultrasonic device 22.

Figure 6:
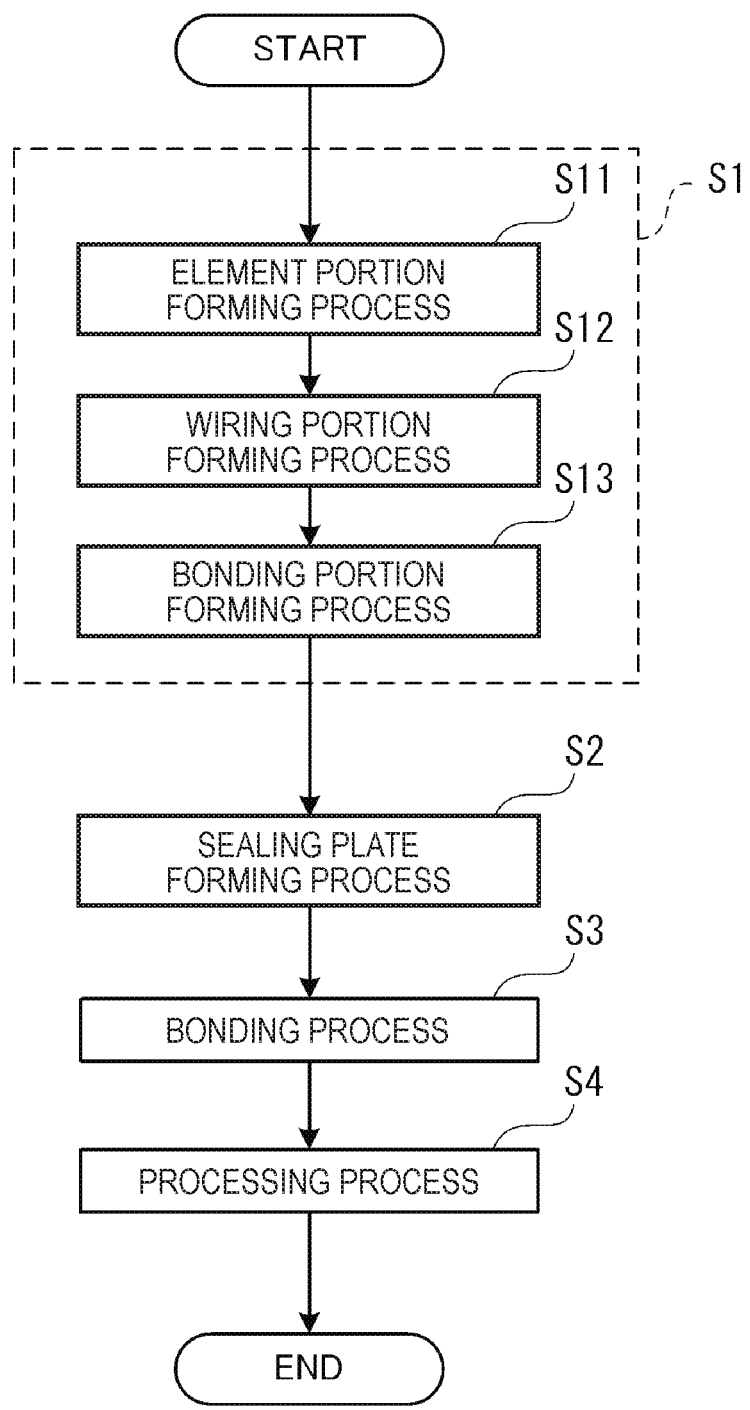
FIG. 6 is a flowchart illustrating an example of a manufacturing method of the ultrasonic device according to the first embodiment.
Figure 7:
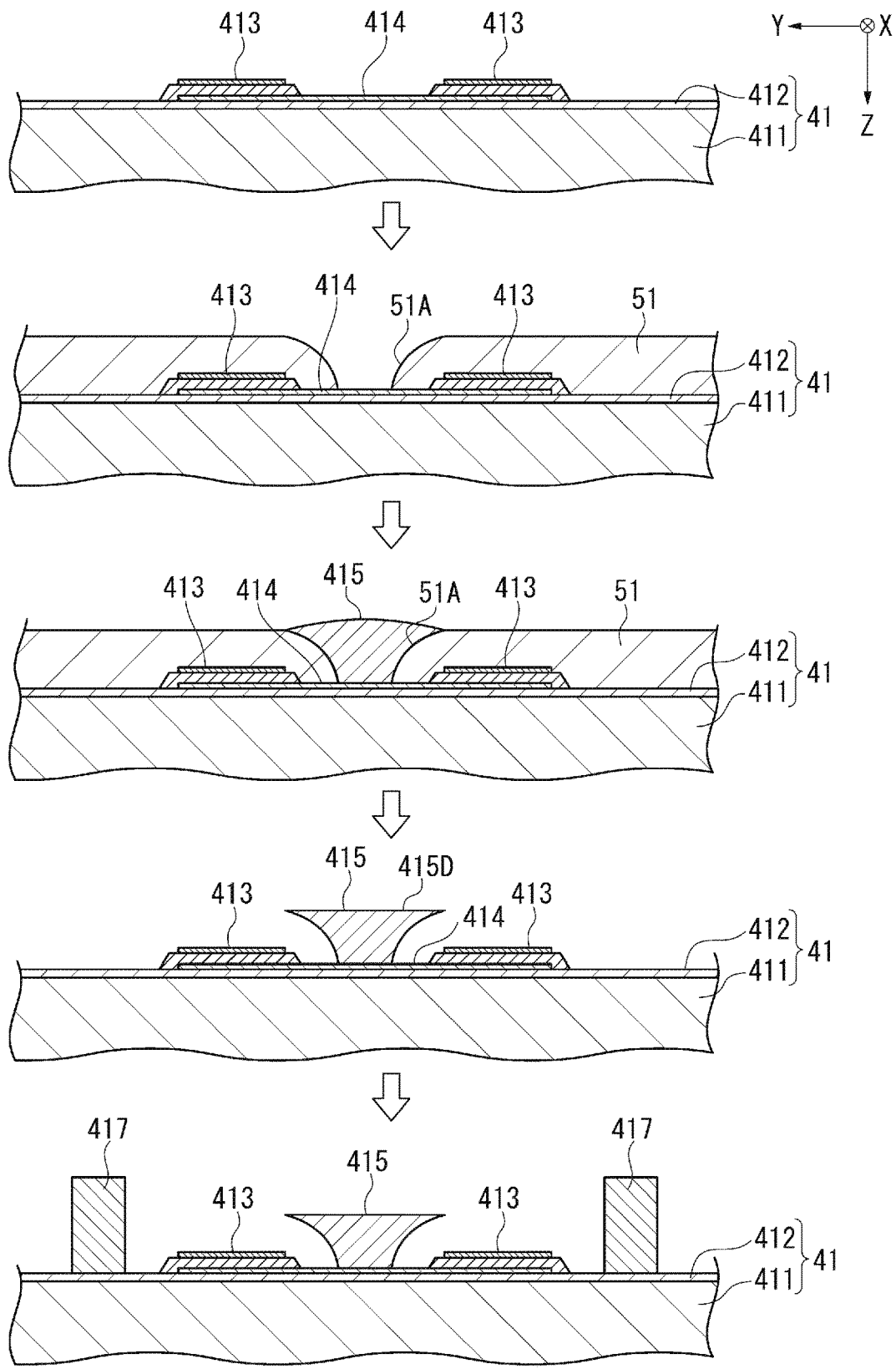
FIG. 7 is a sectional view schematically illustrating an example of a manufacturing process of the ultrasonic device according to the first embodiment.
Figure 8:
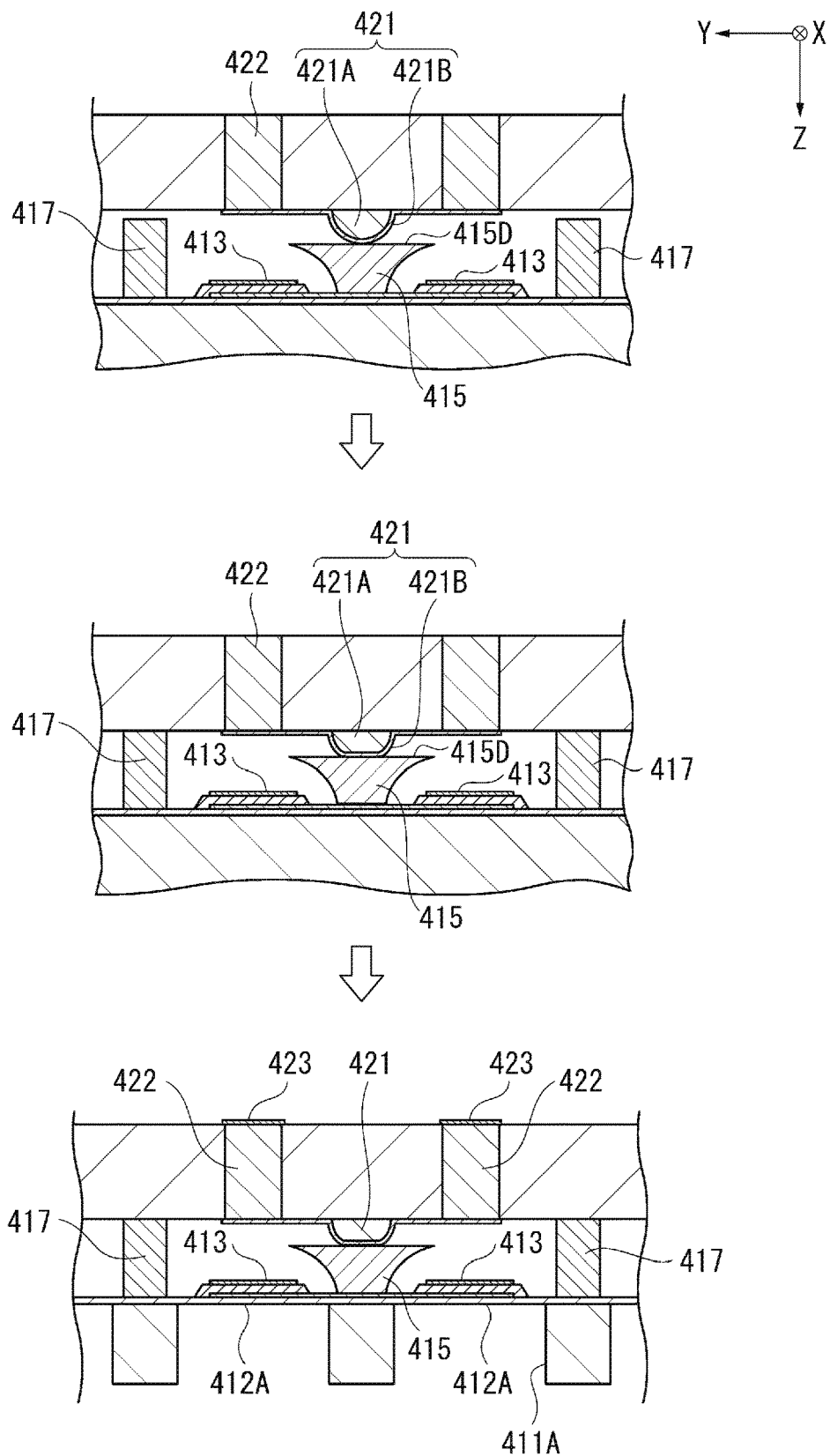
FIG. 8 is a sectional view schematically illustrating an example of a manufacturing process of the ultrasonic device according to the first embodiment.

FIG. 6 is a flowchart illustrating an example of a manufacturing method of the ultrasonic device 22. FIGS. 7 and 8 are diagrams schematically illustrating a manufacturing process of the ultrasonic device 22.

In order to manufacture the ultrasonic device 22, as illustrated in FIG. 6, an element substrate forming process S1, a sealing plate forming process S2, a bonding process S3, and a processing process S4 are performed.

Element Substrate Forming Process

In the element substrate forming process S1, first, as illustrated in the first figure of FIG. 7, the vibration film 412, the piezoelectric elements 413, the lower electrode connection line 414, and the upper electrode extraction line 416 (not illustrated) are formed on the substrate main body portion 411 made of, for example, Si (step S11: element portion forming process). In step S11, a film of Zr is formed on a film of $SiO_2$ which is formed by performing thermal oxidation treatment on the substrate main body portion 411, and thermal oxidation treatment is further performed so as to form a layer of $ZrO_2$ and thus to form the vibration film 412. The lower electrode 413A, the piezoelectric film 413B, and the upper electrode 413C are formed on the vibration film 412, and thus the piezoelectric element 413 is formed. The lower electrode connection line 414 is formed when the lower electrode 413A is formed, and the upper electrode extraction line 416 is formed when the upper electrode 413C is formed. Specifically, first, an electrode material formed as a film on the vibration film 412 through, for example, sputtering is patterned, and thus the lower electrode 413A and the lower electrode connection line 414 are formed. Thereafter, the piezoelectric film 413B is formed on the lower electrode 413A. After the piezoelectric film 413B is formed, the upper electrode 413C and the upper electrode extraction line 416 are formed in the same manner as the lower electrode 413A and the lower electrode extraction line 414.

Next, as illustrated in FIG. 6, the wiring portion 415 is formed on the lower electrode connection line 414 (step S12: wiring portion forming process). In step S12, as illustrated in the second figure of FIG. 7, a mask 51 which has an opening 51A at a forming position of the wiring portion 415 and is used to form the wiring portion 415 is formed. This mask 51 may be formed by using a positive photoresist. As illustrated in the third figure of FIG. 7, the wiring portion 415 is formed on the lower electrode connection line 414 in the opening 51A according to, for example, an electroplating method. A surface of the wiring portion 415 on the −Z side is a projection surface, and protrudes from the opening 51A. Next, as illustrated in the fourth figure of FIG. 7, the flat contact surface 415D is formed by polishing the −Z side surface of the wiring portion 415, and then the mask 51 is removed.

Next, as illustrated in FIG. 6, the bonding portions 417 are formed on the element substrate 41 (step S13: bonding portion forming process). In step S13, for example, a photosensitive resin layer for forming the bonding portions 417 is formed on the element substrate 41, and is patterned so that the bonding portions 417 are formed as illustrated in the fifth figure of FIG. 7.

Sealing Plate Forming Process

Next, as illustrated in FIG. 6, the sealing plate forming process S2 is performed. In step S2, the conduction portion 421 is formed on the inner surface 42A side of the sealing plate 42 provided with the through electrode 422 (not illustrated). In other words, a resin layer for forming the resin section 421A is formed on the inner surface 42A and is then patterned. Thereafter, a resin layer remaining on the inner surface 42A is heated and melted, and is then solidified, and thus the substantially hemispheric resin section 421A is formed. The conductive film 421B is formed to cover surfaces of the resin section 421A and the through electrode 422 on the +Z side.

Bonding Process

Next, as illustrated in FIG. 6, a bonding process of bonding the element substrate 41 and the sealing plate 42 formed as described above together is performed (step S3). In step S3, as illustrated in the first figure of FIG. 8, the sealing plate 42 is disposed on the element substrate 41. In this case, relative positions between the element substrate 41 and the sealing plate 42 are adjusted. In other words, positioning is performed so that the conduction portion 421 overlaps the corresponding wiring portion 415.

After the positioning is performed, as illustrated in the second figure of FIG. 8, at least one of the element substrate 41 and the sealing plate 42 is pressed in a direction in which the element substrate 41 and the sealing plate 42 come close to each other. Consequently, the conduction portion 421 is elastically deformed so as to come into close contact with the wiring portion 415. In this state, the element substrate 41 and the sealing plate 42 are heated (for example, for an hour at 200° C.). Consequently, the bonding portion 417 is melted, and is then solidified again, and thus the element substrate 41 and the sealing plate 42 are bonded to each other.

Processing Process

Next, as illustrated in FIG. 6, a processing process of processing the element substrate 41 and the sealing plate 42 is performed (step S4). In step S4, as illustrated in the third figure of FIG. 8, a thickness of the substrate main body portion 411 of the element substrate 41 is adjusted, and then the openings 411A are formed. A wiring including the lower electrode wires 423 is formed on the outer surface 42B of the sealing plate 42. A wiring on the outer surface 42B side of the sealing plate 42 may be formed in advance. Thereafter, as illustrated in FIG. 3, the openings 411A are filled with the acoustic matching layer 43, and then the protection film 44 is formed. In the above-described way, the ultrasonic device 22 is manufactured.

Operations and Effects of First Embodiment

In the present embodiment, the piezoelectric element 413 and the wiring portion 415 are provided on the rear surface 41A of the element substrate 41. The conduction portion 421 connected to the wiring portion 415 is provided on the inner surface 42A of the sealing plate 42. In the wiring portion 415, an area of the contact surface 415D is larger than an area of the first end section 415A in a plan view viewed from the Z direction. In this configuration, it is possible to increase a connectable area of the conduction portion 421 without changing a dimension of the wiring portion 415 on the rear surface 41A. Therefore, an allowable amount of a positional deviation between the element substrate 41 and the sealing plate 42 can be increased. In other words, in the bonding process in step S3, alignment between the element substrate 41 and the sealing plate 42 is performed. Even if a position of the conduction portion 421 is slightly deviated with respect to the wiring portion 415 at this time, the wiring portion 415 can be electrically connected to the conduction portion 421 as long as the deviation is within a range of the allowable amount, and thus it is possible to improve connection reliability.

It is possible to achieve high-density integration of the piezoelectric element 413. For example, in a case where the conduction portion 421 is connected to an electrode terminal formed on the rear surface 41A, if a dimension of the electrode terminal is made large in order to similarly increase connection reliability, a gap between the piezoelectric elements 413 is required to be increased. In other words, it is difficult to make high-density integration of the piezoelectric element 413 and improvement of connection reliability compatible. In contrast, in the present embodiment, it is possible to increase an area of the contact surface 415D without changing a dimension of the wiring portion 415 on the rear surface 41A. Therefore, the ultrasonic device 22 of the present embodiment can make high-density integration of the piezoelectric element 413 and improvement of connection reliability compatible.

For example, in a case where the conduction portion 421 is connected to the electrode terminal formed on the rear surface 41A, it is possible to achieve high-density integration of the piezoelectric element 413 by reducing an area of the electrode terminal. However, if positioning accuracy is low in a case where the area of the electrode terminal is reduced, there is a problem in that there is concern about interference between the conduction portion 421 and the piezoelectric element 413. In relation to this problem, the conduction portion 421 is connected to the wiring portion 415 protruding toward the sealing plate 42 side, and thus it is possible to prevent interference between the conduction portion 421 and the piezoelectric element 413.

The second end section 415B of the wiring portion 415 protrudes along the XY plane. In this configuration, it is possible to more reliably suppress an increase of an area of the first end section 415A while increasing an area of the contact surface 415D in a plan view. Therefore, it is possible to more reliably realize high-density integration and connection reliability of a functional element.

In the wiring portion 415, the side surface 415C on the side on which the piezoelectric element 413 is disposed is a depressed surface. In other words, when the wiring portion 415 is cut in a YZ plane which passes through positions (central positions) where the piezoelectric element 413 and the wiring portion 415 are disposed and which are along the Z direction, the side surface 415C thereof is curved to be depressed toward the center side of the wiring portion 415. Consequently, the side surface 415C of the wiring portion 415 can be separated from the piezoelectric element 413 compared with a configuration in which the side surface 415C protrudes toward the piezoelectric element 413, or a configuration in which the side surface 415C is linear. Therefore, it is possible to further prevent interference between the piezoelectric element 413 and the wiring portion 415.

The second end section 415B of the wiring portion 415 protrudes so as to project upward (−Z side) of the ultrasonic transducer 45. In other words, apart of the surface of the ultrasonic transducer 45 on the −Z side is covered with the second end section 415B. Consequently, in the bonding process in step S3, even in a case where relative positions between the element substrate 41 and the sealing plate 42 are deviated, and thus the conduction portion 421 is deviated toward the ultrasonic transducer 45 side, it is possible to prevent interference between the wiring portion 415 and the ultrasonic transducer 45.

A single wiring portion 415 is provided with respect to two ultrasonic transducers 45 forming the ultrasonic transducer group 45A. In other words, a single wiring portion 415 is provided with respect to two piezoelectric elements 413 arranged along the Y direction. In this configuration, the number of wiring portions 415 can be reduced, and thus a configuration can be simplified. It is possible to increase an arrangement interval between the wiring portions 415 in the Y direction, and thus to prevent the second end sections 415B of the adjacent wiring portions 415 from contact with each other.

Modification Example of First Embodiment

Figure 9:
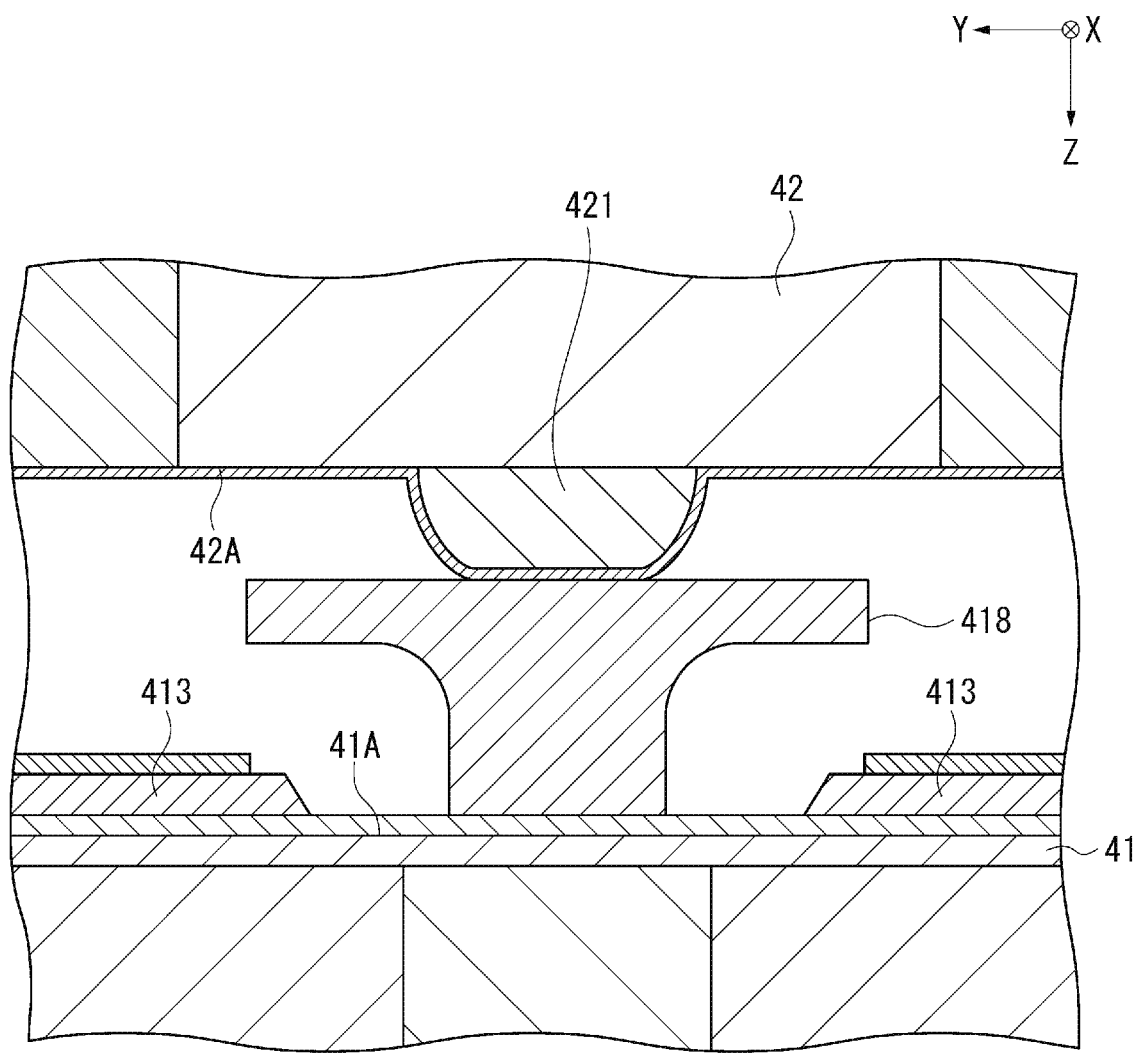
FIG. 9 is a sectional view illustrating a schematic configuration of an ultrasonic device according to a modification example of the first embodiment.
Figure 10:
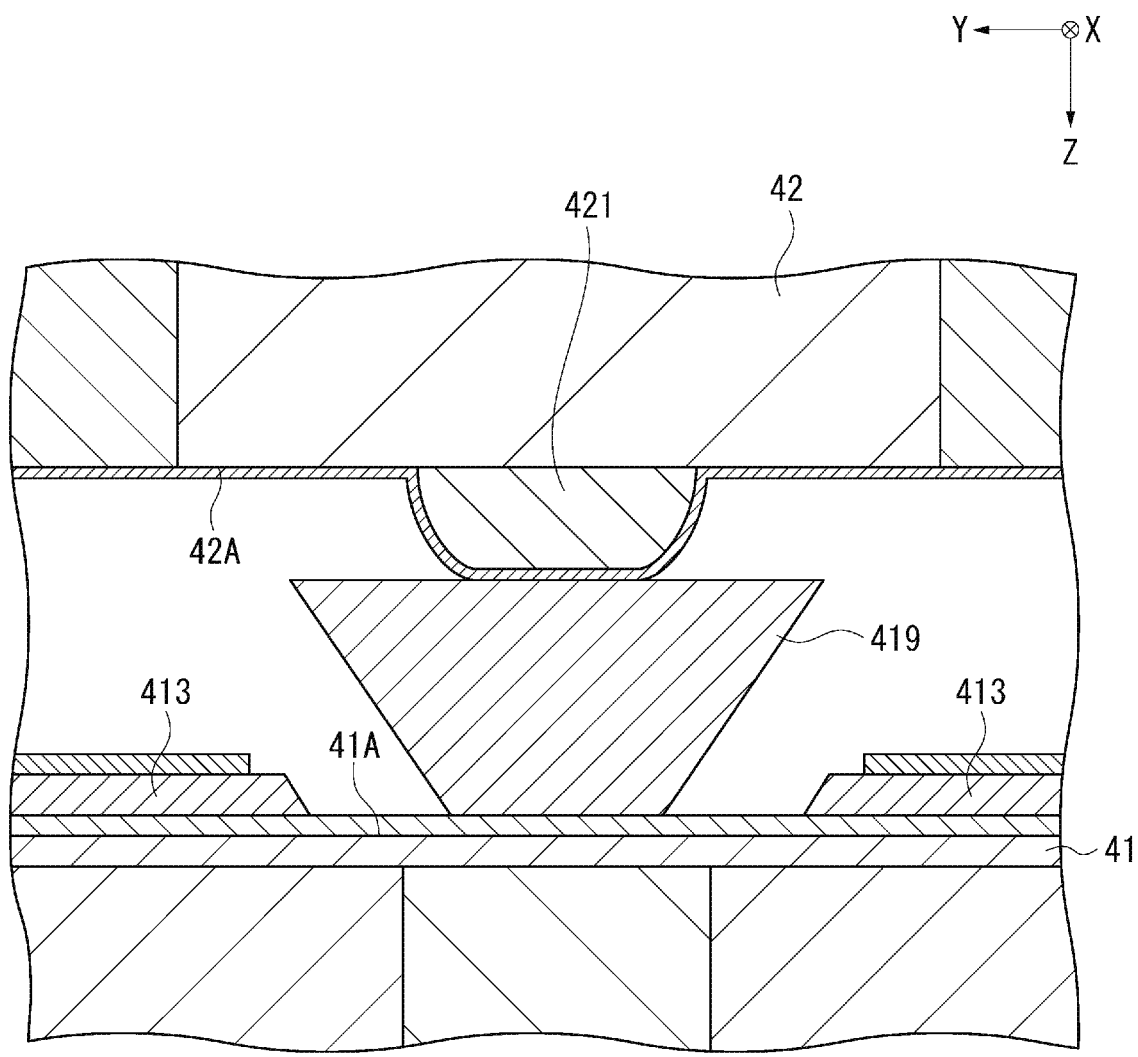
FIG. 10 is a sectional view illustrating a schematic configuration of an ultrasonic device according to a modification example of the first embodiment.

FIGS. 9 and 10 are sectional views schematically illustrating an ultrasonic device according to a modification example of the first embodiment.

In the first embodiment, the side surface of the wiring portion 415 is a depressed surface, and is curved so that an area of the section which is parallel to the XY plane increases toward the sealing plate 42 side from the element substrate 41.

In contrast, as illustrated in FIG. 9, a wiring portion 418 may be formed so that a section thereof which is parallel to the YZ plane has a substantially T shape. In other words, the wiring portion 418 has a rising section which rises along the Z direction on the element substrate 41, and a protrusion section which protrudes toward the piezoelectric element 413 on a −Z side of the rising section.

As illustrated in FIG. 10, a wiring portion 419 may be formed in a tapered outer shape in which an area of a section which is parallel to the XY plane increases toward the sealing plate 42 from the element substrate 41.

Second Embodiment

Next, a description will be made of a second embodiment.

The contact surface 415D of the wiring portion 415 of the first embodiment is formed to be substantially flat. In contrast, a wiring portion of the second embodiment is different from that of the first embodiment in that a contact surface of the wiring portion has a projection.

In the following description, the same constituent elements as those in the first embodiment are given the same reference numerals, and description thereof will be omitted or will be made briefly.

Figure 11:
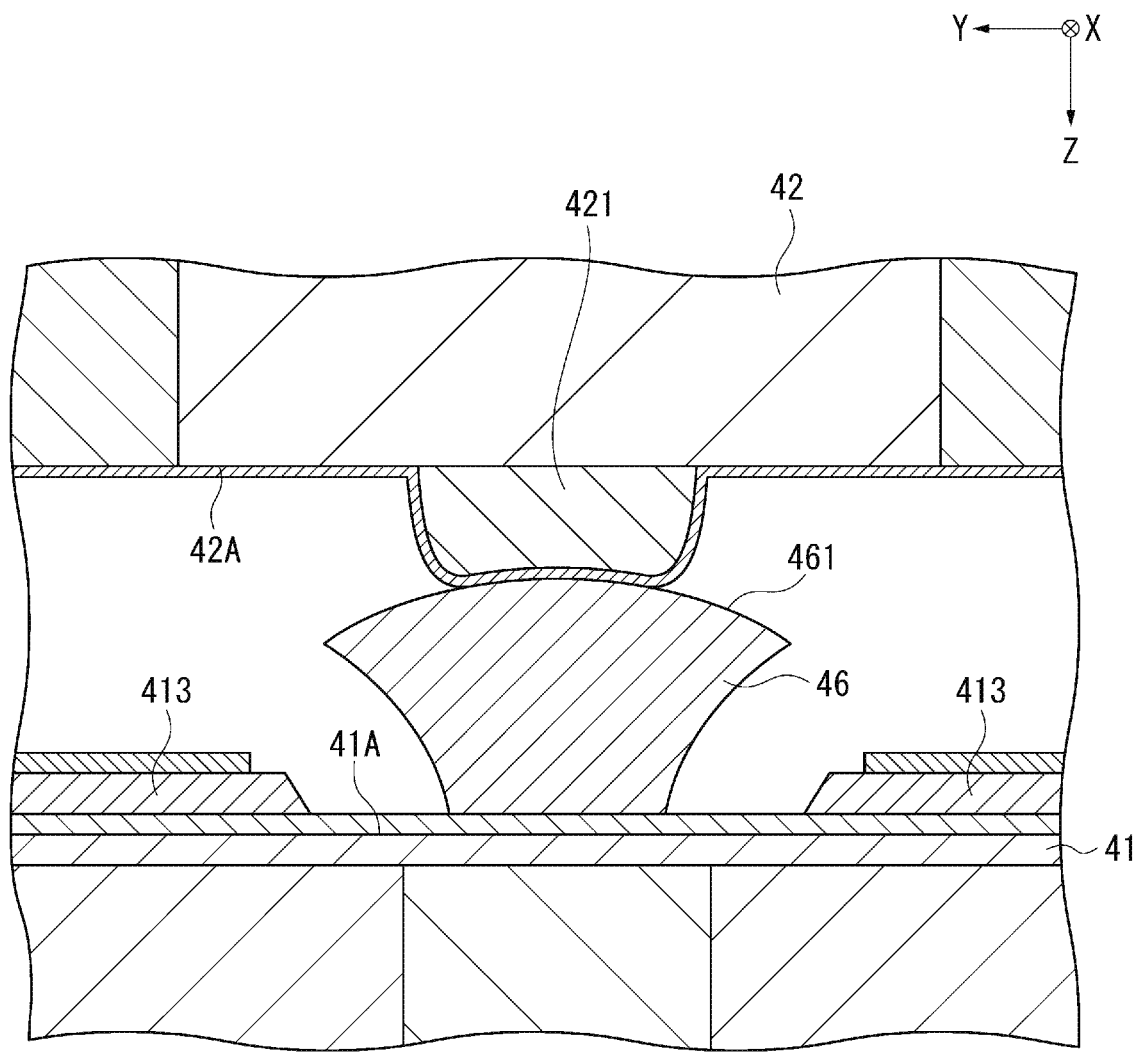
FIG. 11 is a sectional view illustrating a schematic configuration of an ultrasonic device according to a second embodiment.

FIG. 11 is a sectional view schematically illustrating an ultrasonic device according to the second embodiment.

As illustrated in FIG. 11, a contact surface (third surface) 461 of a wiring portion 46 has a projection protruding toward the inner surface (second surface) 42A side of the sealing plate 42. In other words, an end section of the wiring portion 46 on the inner surface (second surface) 42A side of the sealing plate 42 corresponds to a projection.

The conduction portion 421 is elastically deformed along the contact surface 461 in the same manner as in the first embodiment. Consequently, the wiring portion 46 comes into close contact with the conduction portion 421.

The wiring portion 46 may be formed in the substantially same manner as, for example, the wiring portion 415 of the first embodiment, and only step S12 is different. In other words, in the first embodiment, in step S12, the wiring portion 46 is formed in the opening 51A of the mask 51 formed on the element substrate 41, and then the flat contact surface 415D is formed in the wiring portion 46 through polishing. In contrast, in the present embodiment, the wiring portion 46 is formed in the opening 51A of the mask 51, and then the mask is removed without polishing the surface of the wiring portion 46 on the −Z side.

Operations and Effects of Second Embodiment

The contact surface (third surface) 461 of the wiring portion 46 has the projection protruding toward the inner surface (second surface) 42A of the sealing plate 42. In this case, it is possible to increase an area of the contact surface 461 compared with, for example, a case where the contact surface 461 is flat. Therefore, since the conduction portion 421 is in close contact with and along the contact surface 461, a connection area between the conduction portion 421 and the contact surface 461 can be increased, and thus it is possible to reduce contact resistance (electric resistance).

In the present embodiment, the conduction portion 421 is configured to be elastically deformed along the contact surface 461 and thus in close contact therewith. In contrast, a conduction portion may have a depression along the contact surface 461. Also in this case, the conduction portion 421 can be made in close contact with the contact surface 461, and a connection area therebetween can also be increased.

Third Embodiment

Next, a third embodiment will be described with reference to the drawings.

The contact surface 415D of the wiring portion 415 of the first embodiment is formed to be substantially flat. In contrast, a wiring portion of the third embodiment is different from that of the first embodiment in that a contact surface has a depression.

In the following description, the same constituent elements as those in the first embodiment are given the same reference numerals, and description thereof will be omitted or will be made briefly.

Figure 12:
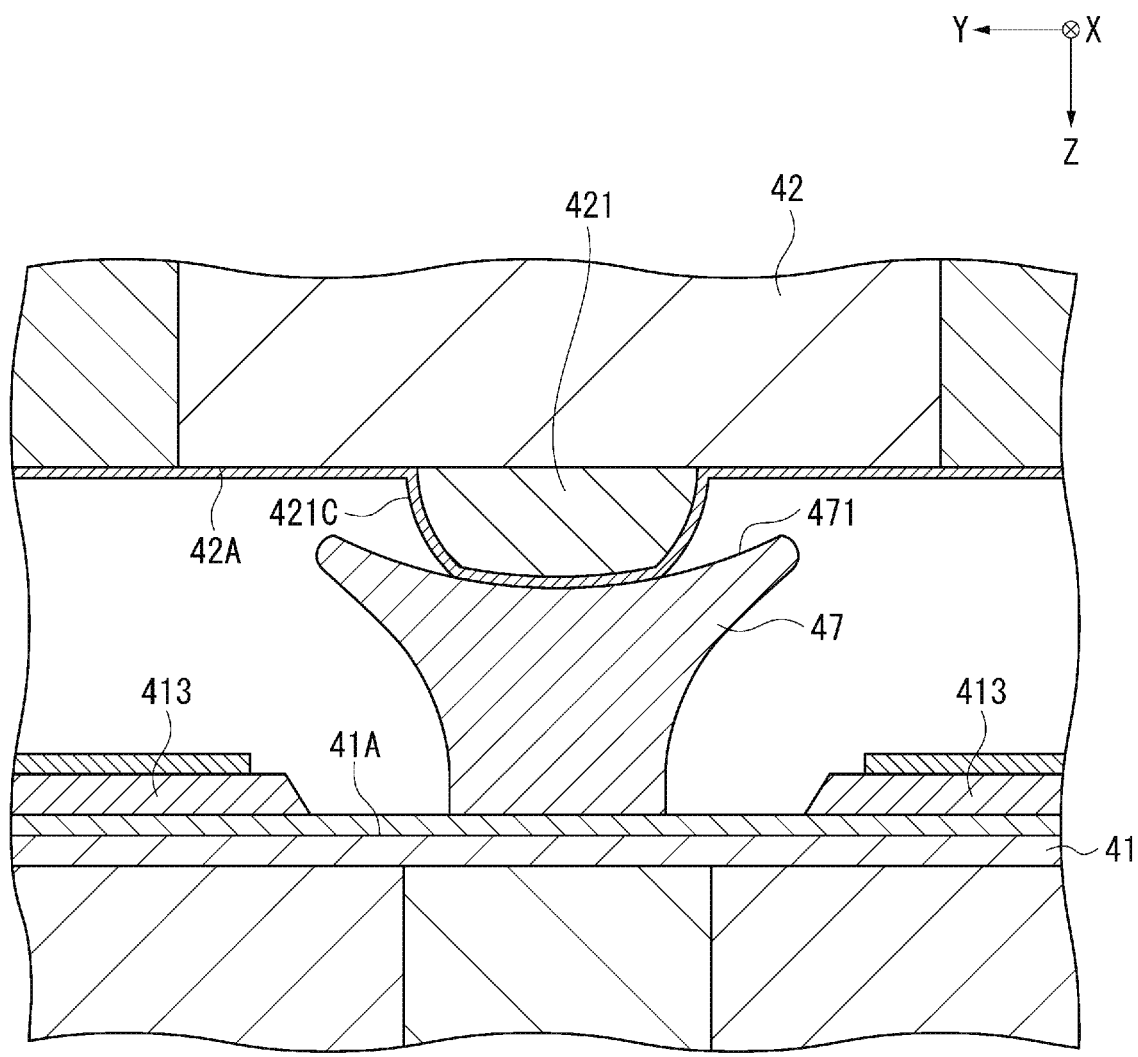
FIG. 12 is a sectional view illustrating a schematic configuration of an ultrasonic device according to a third embodiment.
Figure 13:
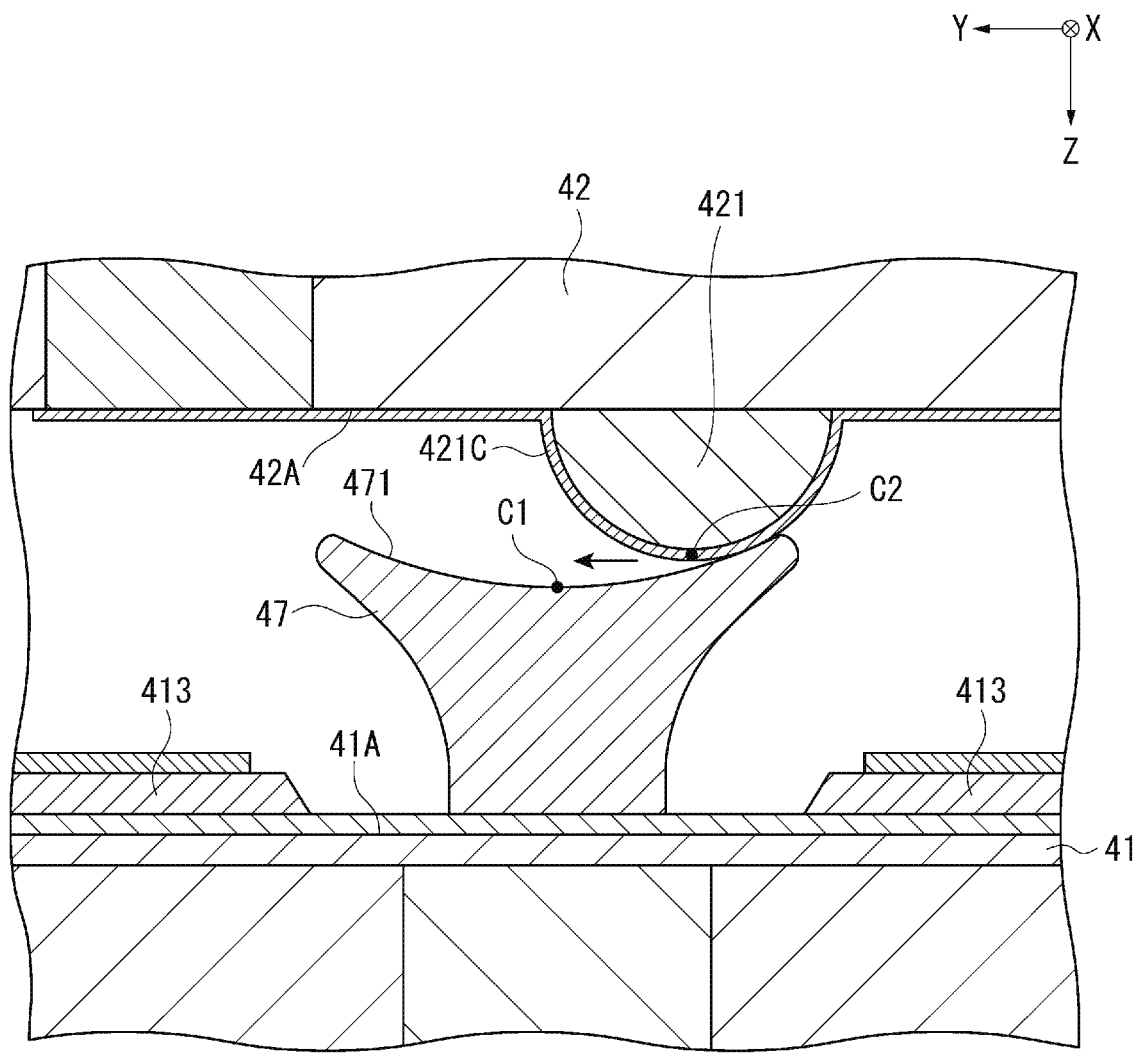
FIG. 13 is a sectional view schematically illustrating a bonding process in the ultrasonic device according to the third embodiment.

FIG. 12 is a sectional view schematically illustrating an ultrasonic device according to a third embodiment. FIG. 13 is a diagram schematically illustrating the ultrasonic device in a bonding process.

As illustrated in FIG. 12, a contact surface (third surface) 471 of a wiring portion 47 has a depression curved to be depressed toward the rear surface (first surface) 41A side of the element substrate 41. In other words, an end section of the wiring portion 47 on the sealing plate 42 side corresponds to a depression and a spherical depression section. The contact surface 471 is curved most toward the rear surface (first surface) 41A side of the element substrate 41 at the center thereof in the X direction and the Y direction. In other words, a distance between the contact surface 471 and the rear surface (first surface) 41A of the element substrate 41 is shortest at the center of the contact surface 471. As illustrated in FIG. 13, the curvature (first curvature) of the contact surface 471 is equal to or less than the curvature (second curvature) of the surface 421C of the conduction portion 421 before being elastically deformed. In the present embodiment, the first curvature of the contact surface 471 is less than the second curvature of the surface 421C of the conduction portion 421.

The conduction portion 421 corresponds to a spherical projection section having the surface 421C which is spherically curved with the second curvature. The conduction portion 421 is elastically deformed along the contact surface 471 in the same manner as in the first embodiment. Consequently, the wiring portion 47 comes into close contact with the conduction portion 421.

In the present embodiment, positional deviation between the element substrate 41 and the sealing plate 42 can be adjusted in the bonding process in step S3. In other words, in the bonding process, as illustrated in FIG. 13, there is a case where the accuracy of positioning between the element substrate 41 and the sealing plate 42 is not sufficient, and a central position C1 of the wiring portion 47 is deviated with respect to a central position C2 of the conduction portion 421. In the present embodiment, even in a case where deviation occurs between the central positions C1 and C2, the conduction portion 421 is moved along the curved contact surface 471 in a direction in which the central positions C1 and C2 match each other.

Operations and Effects of Third Embodiment

The contact surface (third surface) 471 of the wiring portion 47 has the depression curved to be depressed toward the rear surface (first surface) 41A side of the element substrate 41. In this configuration, even if positional deviation of the conduction portion 421 occurs with respect to the contact surface 471 during wiring connection, the wiring portion 47 and the conduction portion 421 can be relatively moved along the curve of the contact surface 471. In other words, the wiring portion 47 and the conduction portion 421 can be relatively moved in a direction in which the central positions C1 and C2 of the wiring portion 47 and the conduction portion 421 match each other. Therefore, it is possible to increase the accuracy of positioning between the element substrate 41 and the sealing plate 42.

The conduction portion 421 has the projecting curved surface which is a protrusion protruding toward the rear surface (first surface) 41A of the element substrate 41. In this configuration, during wiring connection, the conduction portion 421 is inserted into the contact surface 471 which is a depressed surface, and thus the element substrate 41 and the sealing plate 42 can be positioned. Therefore, it becomes easier to position the element substrate 41 and the sealing plate 42, and it is possible to improve the accuracy of positioning.

Here, the curvature of the contact surface 471 is equal to or less than the curvature of the surface 421C of the conduction portion 421. In this configuration, the conduction portion 421 can be more reliably moved along the contact surface 471.

Fourth Embodiment

Next, a fourth embodiment will be described with reference to the drawings.

The contact surface 415D of the wiring portion 415 of the first embodiment is formed to be substantially flat. In contrast, a wiring portion of the fourth embodiment is different from that of the first embodiment in that a contact surface has a depression which is depressed toward the element substrate side. In the third embodiment, the curvature of the wiring portion is equal to or less than the curvature of the conduction portion. In contrast, in the fourth embodiment, there is a difference in that the curvature of the wiring portion is less than the curvature of the conduction portion.

In the following description, the same constituent elements as those in the first embodiment are given the same reference numerals, and description thereof will be omitted or will be made briefly.

Figure 14:
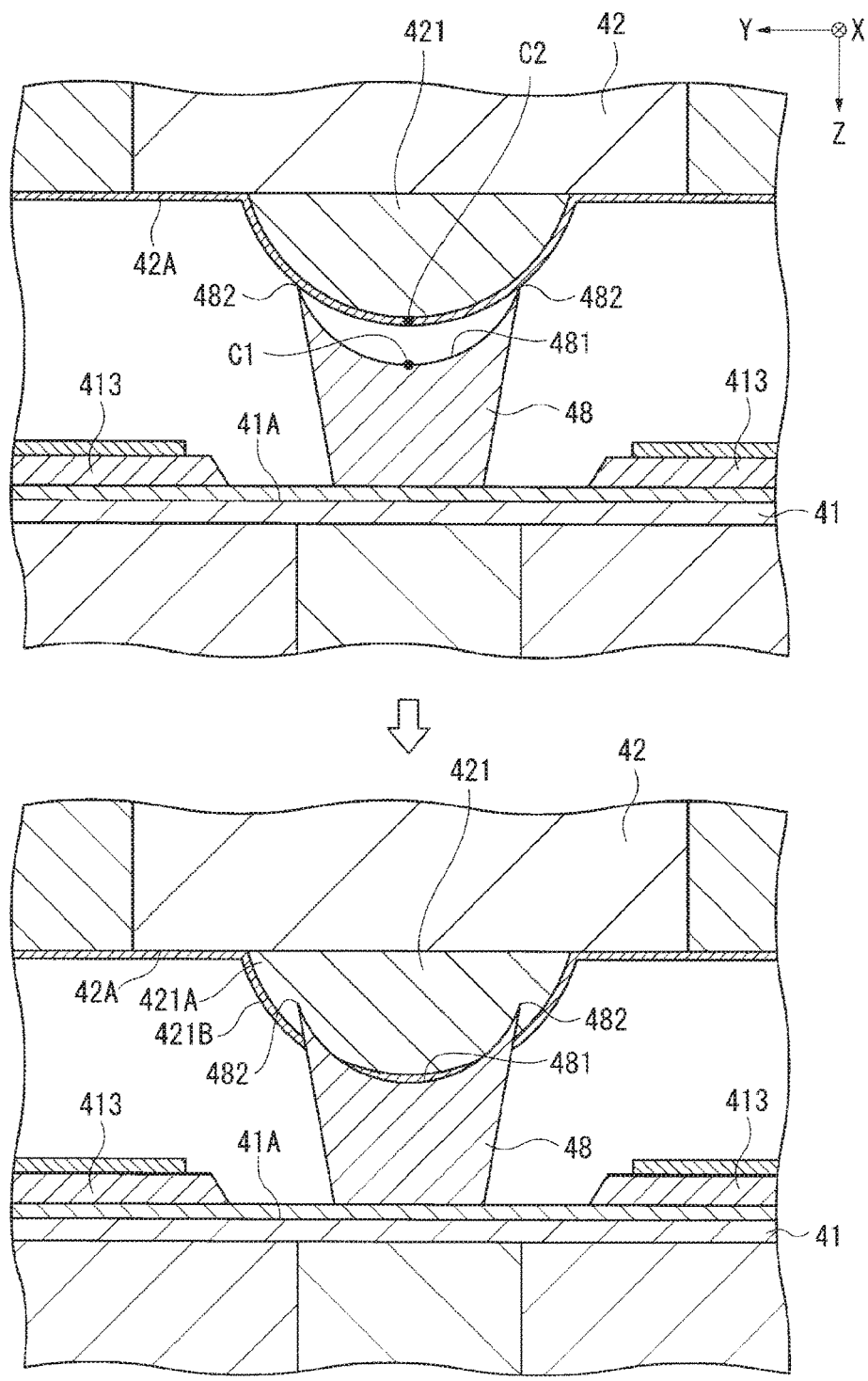
FIG. 14 is a sectional view illustrating a schematic configuration of an ultrasonic device according to a fourth embodiment.

FIG. 14 is a sectional view schematically illustrating an ultrasonic device according to the fourth embodiment.

In a wiring portion 48 illustrated in FIG. 14, a dimension thereof in the X direction and the Y direction increases toward the sealing plate 42 side from the element substrate 41 side. The wiring portion 48 has a contact surface 481 curved to be depressed toward the element substrate 41 side. The contact surface 481 is a depressed and curved surface which is substantially hemispherical. In other words, an end section of the wiring portion 48 on the sealing plate 42 side corresponds to a spherical depression section. The contact surface 481 is curved most toward the element substrate 41 side at the center thereof in the X direction and the Y direction. As illustrated in FIG. 14, the curvature (first curvature) of the contact surface 481 is larger than the curvature (second curvature) of the conduction portion 421 before being elastically deformed.

The conduction portion 421 is elastically deformed along the contact surface 481 in the same manner as in the first embodiment. Consequently, the wiring portion 48 comes into close contact with the conduction portion 421.

In the fourth embodiment, an end edge (that is, an outer circumferential edge of the contact surface 481 when viewed from the Z direction) 482 of the contact surface 481 on the −Z side penetrates through the conductive film 421B of the conduction portion 421 and reaches the resin section 421A.

Operations and Effects of Fourth Embodiment

As described above, in the bonding process of bonding the element substrate 41 to the sealing plate 42, the wiring portion 48 comes into close contact with the conduction portion 421 through positioning between the element substrate 41 and the sealing plate 42. In this case, it is easy to align locations (XY locations) of a central position C3 of the wiring portion 48 and a central position C2 of the conduction portion 421 in the X direction and the Y direction with each other. In other words, there is a case where XY locations of the central positions C2 and C3 are deviated with respect to each other before the wiring portion 48 is brought into close contact with the conduction portion 421. Also in this case, the conduction portion 421 has the curvature more than that of the contact surface 481, and is thus easily moved along the contact surface 481 in a direction in which the XY locations of the central positions C2 and C3 match each other. It is possible to easily perform positioning between the element substrate 41 and the sealing plate 42 with high accuracy.

Here, the bonding portion 417 is overheated and melted in a state in which the element substrate 41 and the sealing plate 42 come into pressure contact with each other through positioning. At this time, if positional deviation occurs between the element substrate 41 and the sealing plate 42, the accuracy of positioning is reduced. In contrast, the end edge 482 of the contact surface 481 penetrates through the conductive film 421B and reaches the resin section 421A. Consequently, in the bonding process, it is possible to reduce the occurrence of positional deviation between the element substrate 41 and the sealing plate 42 and thus to prevent a reduction in the positioning accuracy. The end edge 482 functions as a sliding preventing section which prevents sliding between the wiring portion 48 and the conduction portion 421.

Fifth Embodiment

Next, a fifth embodiment will be described with reference to the drawings.

The contact surface 415D of the wiring portion 415 of the first embodiment is formed to be substantially flat. In contrast, there is a difference from the first embodiment in that irregularities as a sliding preventing section are formed on at least one of a wiring portion and a conduction portion of the fifth embodiment.

In the following description, the same constituent elements as those in the first embodiment are given the same reference numerals, and description thereof will be omitted or will be made briefly.

Figure 15:
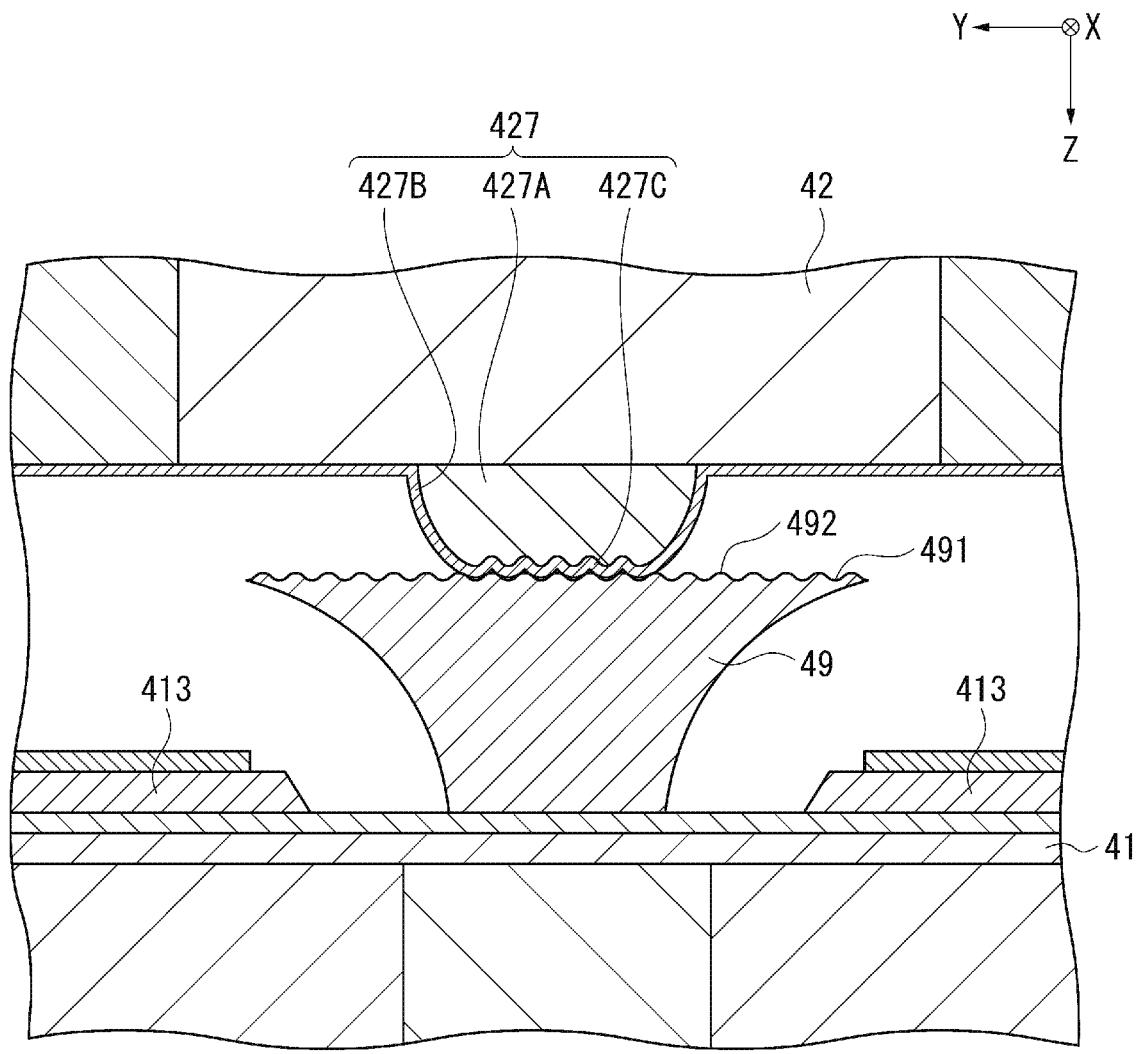
FIG. 15 is a sectional view illustrating a schematic configuration of an ultrasonic device according to a fifth embodiment.

FIG. 15 is a sectional view schematically illustrating an ultrasonic device according to the fifth embodiment.

As illustrated in FIG. 15, in a wiring portion 49, a plurality of irregularities 492 are formed on a contact surface 491 (corresponding to a fourth surface) connected to a conduction portion 427. In FIG. 15, the irregularities 492 are formed on the substantially entire contact surface 491, but may be formed on a part of the contact surface 491, for example, a central portion in the X direction and the Y direction. The irregularities 492 are a sliding preventing section preventing sliding between the wiring portion 49 and the conduction portion 427. The irregularities 492 may be formed on the contact surface 491 according to, for example, a pulse plating method. The irregularities 492 may be formed by patterning the contact surface 491 and processing the contact surface 491 through wet etching.

The conduction portion 427 has a resin section 427A and a conductive film 427B, and a plurality of irregularities 427C are formed at a part thereof including an end section on the +Z side. The irregularities 427C is a sliding preventing section preventing sliding between the wiring portion 49 and the conduction portion 427. The irregularities 427C of the conduction portion 427 have shapes corresponding to the irregularities 492 of the wiring portion 49 side. In other words, the conduction portion 427 substantially matches the wiring portion 49 in terms of a depth of a depression, a height of a projection, or a formation pitch of the irregularities.

The conduction portion 427 is elastically deformed along the contact surface 491 in the same manner as in the first embodiment. At this time, the wiring portion 49 and the conduction portion 427 come into close contact with each other in a state in which the irregularities 427C and 492 of the conduction portion 427 and the wiring portion 49 are fitted to each other.

Operations and Effects of Fifth Embodiment

The wiring portion 49 and the conduction portion 427 are provided with the irregularities. In this configuration, sliding between the wiring portion 49 and the conduction portion 427 can be prevented during wiring connection, and thus it is possible to prevent a reduction in positioning accuracy due to sliding. It is possible to prevent a reduction in positioning accuracy with a simple configuration in which the wiring portion 49 and the conduction portion 427 having irregularities comes into close contact with each other.

The conduction portion 427 has the irregularities 427C along the irregularities 492 of the wiring portion 49 side, the conduction portion 427 can be elastically deformed, and comes into close contact with the wiring portion 49 in a state in which the irregularities 427C are fitted to the irregularities 492. In this configuration, it is possible to more reliably prevent sliding between the wiring portion 49 and the conduction portion 427 due to an anchor effect.

Modification Examples

The invention is not limited to the above-described embodiments, and configurations obtained through modifications, alterations, and combinations of the respective embodiments as appropriate within the scope capable of achieving the object of the invention are included in the invention.

For example, in the fourth embodiment, the wiring portion 48 is configured to have a larger area on the sealing plate 42 side than on the element substrate 41 side, but is not limited thereto, and areas of the wiring portion are substantially the same from the element substrate 41 side to the sealing plate 42 side.

Figure 16:
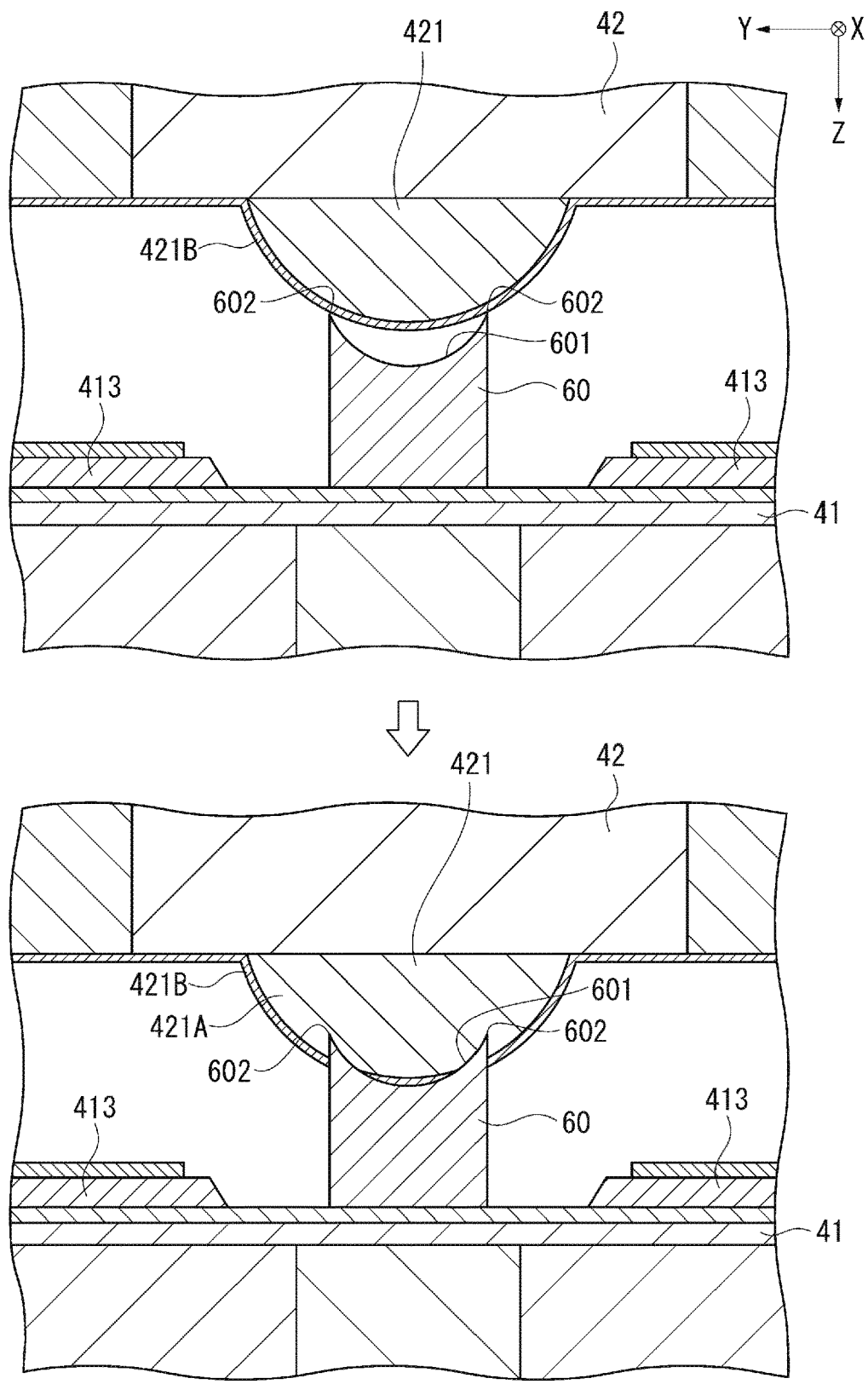
FIG. 16 is a sectional view illustrating a schematic configuration of an ultrasonic device according to another modification example.

FIG. 16 is a sectional view schematically illustrating an ultrasonic device according to a modification example of the fourth embodiment.

As illustrated in FIG. 16, in a wiring portion 60, sectional shapes (sectional areas) which are parallel to the X direction and the Y direction are substantially the same as each other along the Z direction. The wiring portion 60 has a contact surface 601 curved to be depressed toward the element substrate 41 side. The contact surface 601 is a depressed and curved surface which is substantially hemispherical. The curvature of the contact surface 601 is larger than the curvature of the conduction portion 421 before being deformed. The contact surface 601 is formed by processing an end section of the wiring portion 60 on the −Z side through wet etching or the like. Step difference or depressions corresponding to the contact surface 601 may be formed on a metal base layer which is formed in advance on the +Z side of the wiring portion 60, and the wiring portion 60 may be formed on the metal base layer according to an electroplating method.

An end edge 602 of the contact surface 601 penetrates through the conductive film 421B of the conduction portion 421 and reaches the resin section 421A. The end edge 602 functions as a sliding preventing section.

Also in this configuration, in the same manner as in the fourth embodiment, the conduction portion 421 is easily moved along the contact surface 601 in a direction in which the XY locations of the central positions match each other, and it is possible to easily perform positioning between the element substrate 41 and the sealing plate 42 with high accuracy.

In the fourth embodiment and the modification example, a description has been made of an example of a configuration in which the end edge of the wiring portion having the depression penetrates through the conductive film of the conduction portion, but this is only an example. For example, the conduction portion may be elastically deformed along the contact surface of the wiring portion in a state in which the end edge of the wiring portion does not penetrate through the conductive film.

In the fifth embodiment, the wiring portion 49 is configured to have a larger area on the sealing plate 42 side than on the element substrate 41 side, but is not limited thereto, and areas of the wiring portion are substantially the same from the element substrate 41 side to the sealing plate 42 side.

Figure 17:
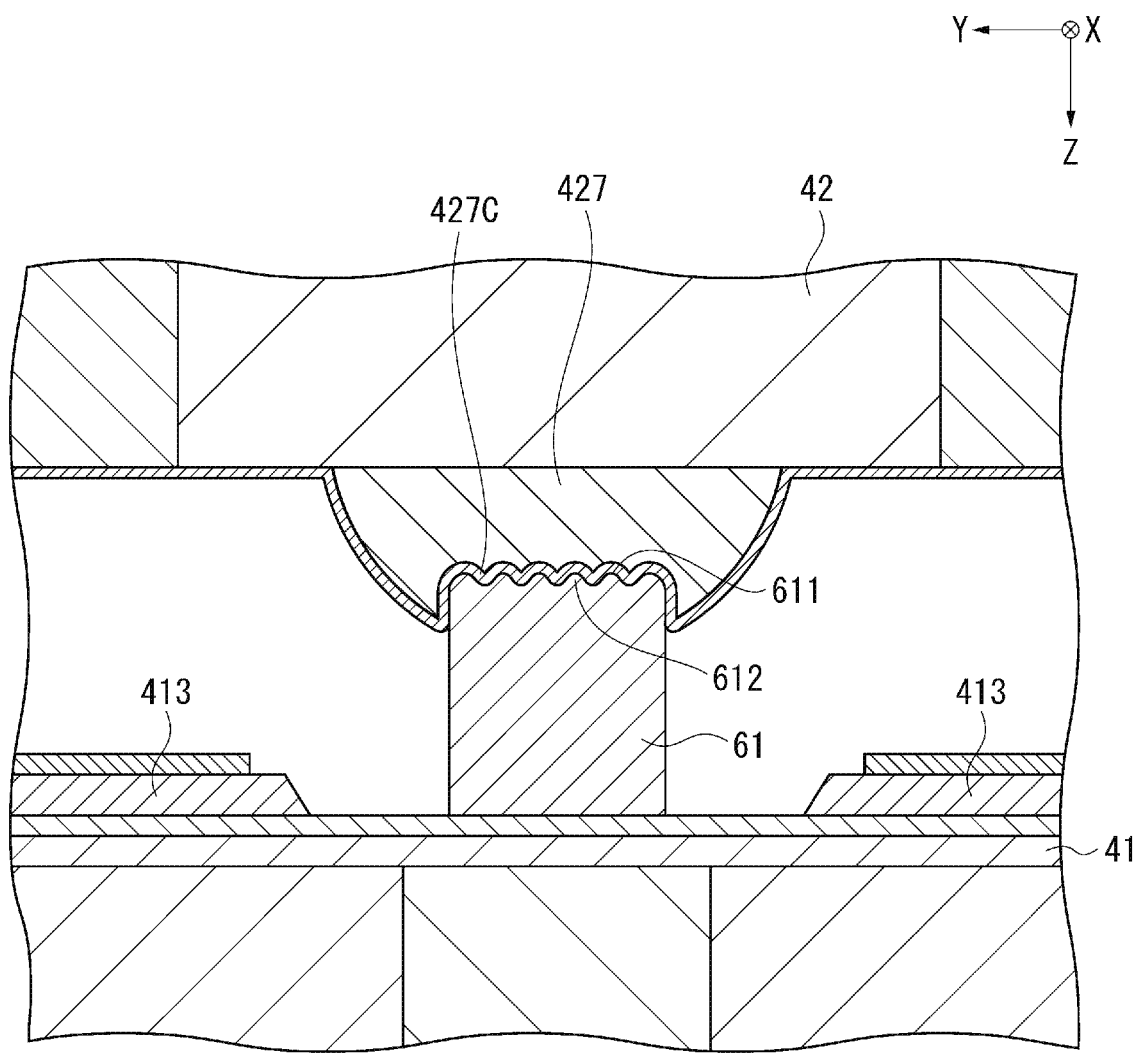
FIG. 17 is a sectional view illustrating a schematic configuration of an ultrasonic device according to still another modification example.

FIG. 17 is a sectional view schematically illustrating an ultrasonic device according to a modification example of the fifth embodiment.

As illustrated in FIG. 17, in a wiring portion 61, sectional shapes (sectional areas) which are parallel to the X direction and the Y direction are substantially the same as each other along the Z direction. The wiring portion 61 has a contact surface 611 provided with a plurality of irregularities 612. In FIG. 17, the irregularities 612 are formed on the substantially entire contact surface 611, but may be formed on apart of the contact surface 611, for example, a central portion in the X direction and the Y direction. The conduction portion 427 is elastically deformed along the contact surface 611 in the same manner as in the first embodiment. At this time, the wiring portion 61 and the conduction portion 427 come into close contact with each other in a state in which the irregularities 427C and 612 of the conduction portion 427 and the wiring portion 61 are fitted to each other. Consequently, it is possible to more reliably prevent sliding between the wiring portion 61 and the conduction portion 427.

Figure 18:
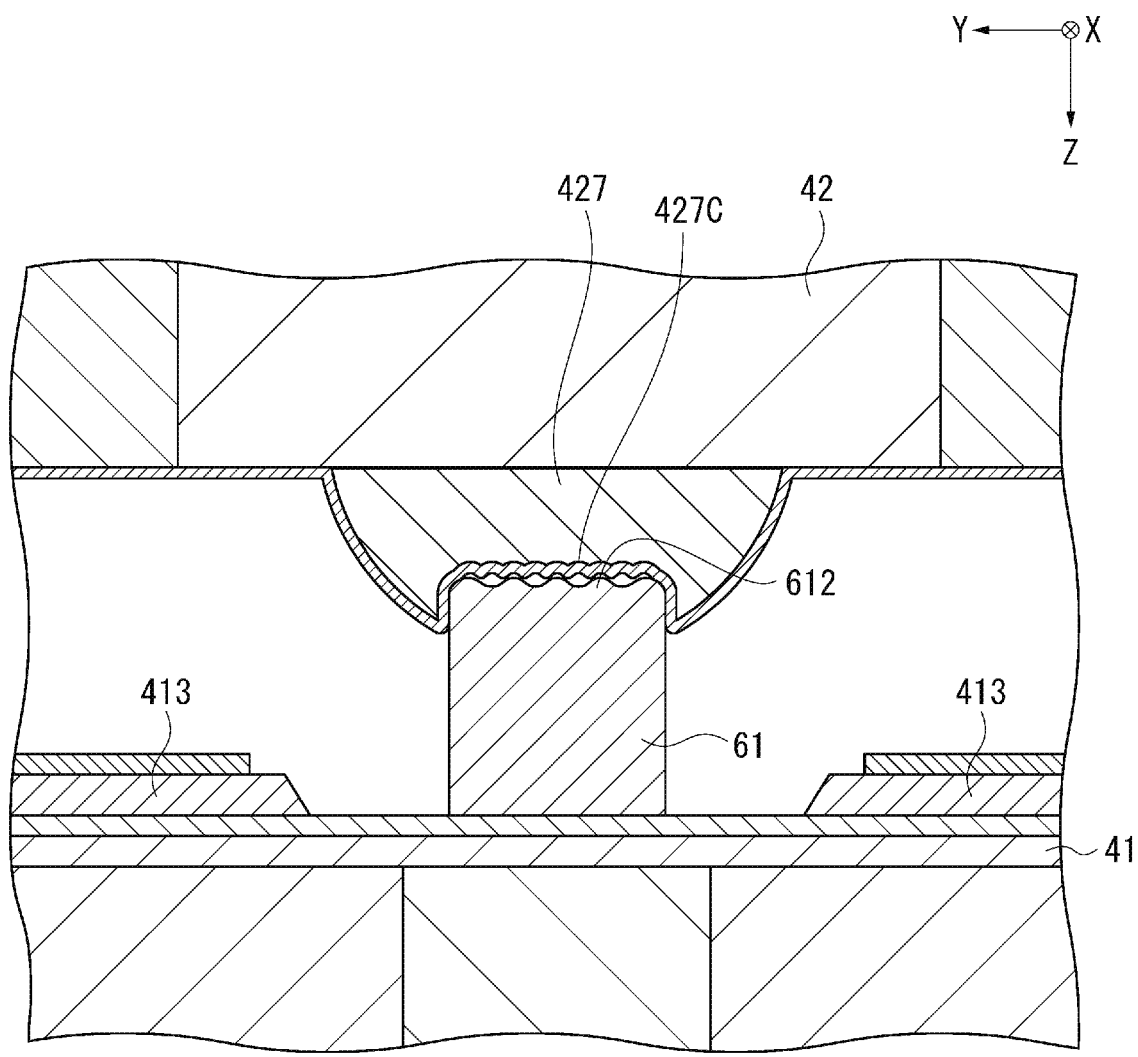
FIG. 18 is a sectional view illustrating a schematic configuration of an ultrasonic device according to still another modification example.

FIG. 18 is a sectional view schematically illustrating an ultrasonic device according to a modification example of the fifth embodiment.

As illustrated in FIG. 18, the wiring portion 61 and the conduction portion 427 have different dimensions of irregularities. In an example illustrated in FIG. 18, sizes of the irregularities 427C of the conduction portion 427, that is, depths of depressions, heights of projections, and a pitch of the irregularities are smaller than those of the irregularities 612 of the wiring portion 61. Also in this configuration, at least a part of the conduction portion 427 is elastically deformed along the irregularities 612 of the wiring portion 61. Consequently, it is possible to more reliably prevent sliding between the wiring portion 61 and the conduction portion 427.

In the fifth embodiment, irregularities are formed in both of the wiring portion and the conduction portion as sliding preventing sections, but this is only an example, and sliding preventing sections may be formed in at least one of the wiring portion and the conduction portion.

In the fifth embodiment, the wiring portion is provided with irregularities as a sliding preventing section, but is not limited thereto, and any configuration may be employed as long as sliding between the wiring portion and the conduction portion can be prevented.

Figure 19:
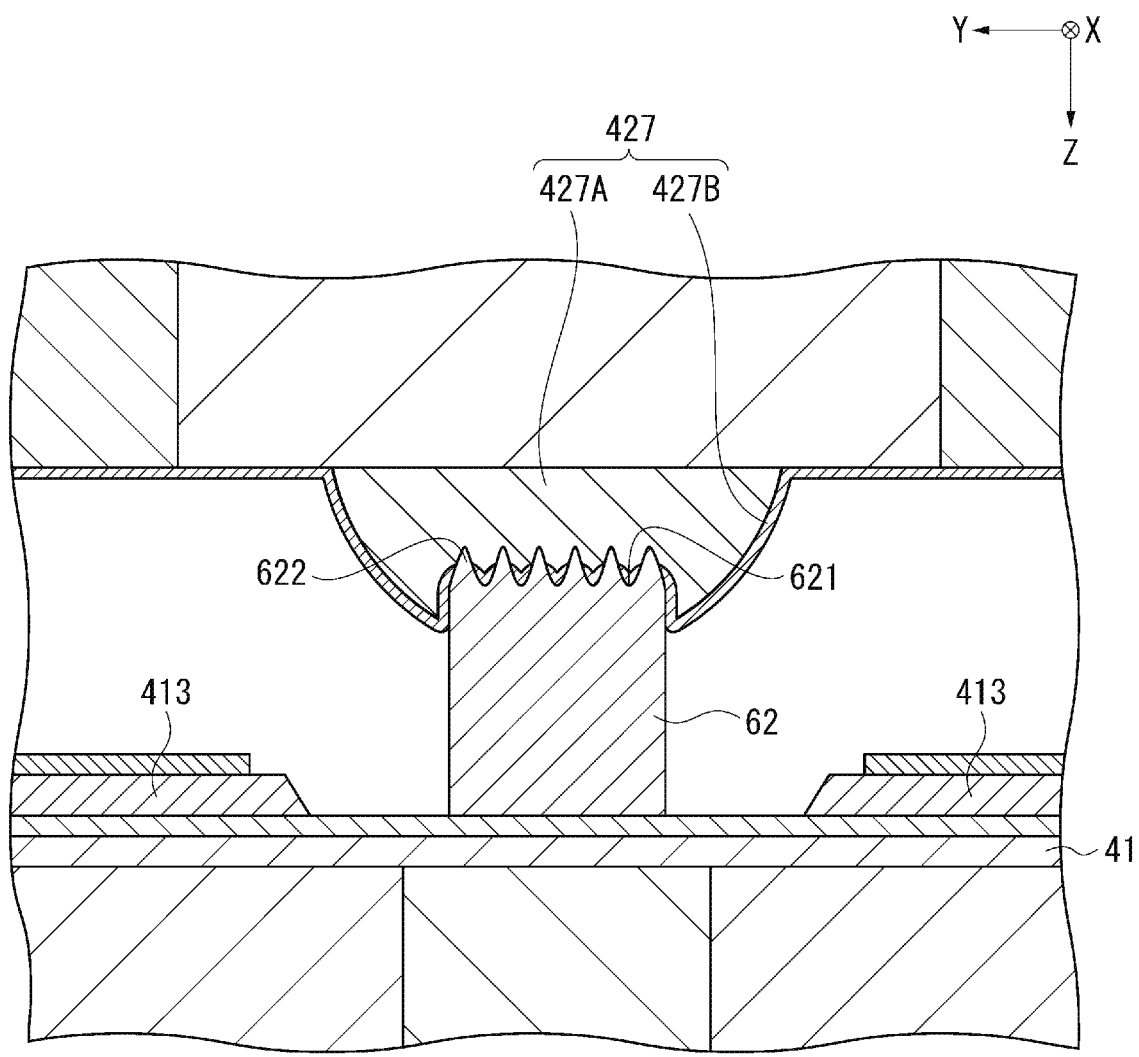
FIG. 19 is a sectional view illustrating a schematic configuration of an ultrasonic device according to still another modification example.

FIG. 19 is a sectional view illustrating a modification example of the ultrasonic device. As illustrated in FIG. 19, a wiring portion 62 has a plurality of protrusions 622 protruding toward the −Z side from a contact surface 621. The protrusions 622 penetrate through the conductive film 427B of the conduction portion 427, and reach the resin section 427A. Consequently, it is possible to more reliably prevent sliding between the wiring portion 62 and the conduction portion 427.

In the second to fourth embodiments, a description has been made of an example of a configuration in which the wiring portion and the conduction portion do not have sliding preventing sections, but this is only an example, and at least one of the wiring portion and the conduction portion may have sliding preventing sections.

For example, in the configuration of the second embodiment, irregularities are formed on the contact surface of the wiring portion, and thus it is possible to increase a surface area of the contact surface and thus to further reduce contact resistance.

For example, in the configurations of the third and fourth embodiments, a rough surface as a sliding preventing section may be formed in at least one of the wiring portion and the conduction portion. Consequently, it is possible to prevent sliding between the wiring portion and the conduction portion in a state in which the element substrate and the sealing plate are brought into pressure contact with each other.

In the above-described embodiments, a description has been made of an example of a configuration in which a section of the wiring portion along the XY plane is substantially circular, but this is only an example. For example, the section may have various polygonal shapes such as a rectangular shape.

In the above-described respective embodiments, a configuration has been exemplified in which the second end section of the wiring portion extend sections not only to ±Y sides on which the piezoelectric elements 413 are disposed but also to ±X sides on which the piezoelectric elements 413 are not disposed, with respect to the wiring portion. However, the invention is not limited thereto, and, for example, the second end section may extend section only to ±Y sides on which the piezoelectric elements 413 are disposed.

In the above-described embodiments, the wiring portion may be configured to include a coating section which coats the wiring portion. The coating section is formed by using a material such as Au having a relatively high electric conductivity, and thus it is possible to reduce contact resistance between the wiring portion and the conduction portion. In a case where a conductive film and a coating section of the conduction portion are formed by using Au, it is possible to improve connection reliability through diffusion bonding between Au layers.

In the above-described embodiments, the wiring portion on the element substrate 41 side is made of a conductive material such as metal. The conduction portion of the sealing plate 42 is configured to include the resin section and the metal film and to be able to be elastically deformed. However, the invention is not limited thereto, and, for example, the conduction portion may also be made of a conductive material such as metal. In a case where the conduction portion does not include an elastic material layer such as a resin section, the conduction portion preferably has an outer shape along a surface of the wiring portion so as to be able to be in close contact with the wiring portion. The wiring portion and the conduction portion may be configured to include resin sections and metal films and thus to be able to be elastically deformed.

In the above-described embodiments, the ultrasonic transducer group 45A formed of two ultrasonic transducers 45 is used as a single transmission/reception channel, but the ultrasonic transducer group 45A may be formed by connecting the lower electrodes 413A of three or more ultrasonic transducers 45 to each other. There may be a configuration in which the lower electrodes 413A of the respective ultrasonic transducers 45 are separate from each other, and thus each of the ultrasonic transducers 45 is individually driven. In this case, each ultrasonic transducer 45 may function as a single transmission/reception channel.

In the above-described embodiment, a description has been made of an example of the ultrasonic device 22 having a two-dimensional array structure in which the ultrasonic transducer groups 45A each functioning as a single transmission/reception channel are disposed in a matrix in the array region Ar1 of the element substrate 41, but this is only an example. For example, the ultrasonic device may have a one-dimensional array structure in which a plurality of transmission/reception channels are disposed along one direction. For example, the ultrasonic transducer group 45A may be formed of a plurality of ultrasonic transducers 45 disposed along the X direction, and a plurality of ultrasonic transducer groups 45A are disposed in the Y direction so as to form the ultrasonic array UA having a one-dimensional array structure.

In the above-described embodiments, a description has been made of an example of a configuration in which the ultrasonic transducer 45 is formed of the vibration film 412 and the piezoelectric element 413 formed on the vibration film 412, but this is only an example. For example, the ultrasonic transducer 45 may be configured to include a flexible film, a first electrode provided on the flexible film, and a second electrode provided at a position opposing the first electrode in a sealing plate. The first electrode and the second electrode form an electrostatic actuator as a vibrator. In this configuration, an ultrasonic wave can be transmitted by driving the electrostatic actuator, and an ultrasonic wave can be detected by detecting electrostatic capacitance between the electrodes.

In the above-described embodiments, an ultrasonic apparatus which measures an organ of a living body has been described as an example of an electronic apparatus, but the invention is not limited thereto. For example, the configurations of the above-described embodiments and respective modification examples may be applied to a measurement apparatus which measures various structural bodies, and detects a defect of a structural body or inspects aging thereof. This is also the same for a measurement apparatus which measures, for example, a semiconductor package or a wafer, and detects a defect of such a measurement target.

In the above-described embodiments, a description has been made of an example of a configuration in which the ultrasonic transducer is provided on the element substrate, but the invention is not limited thereto. For example, the configurations of the embodiments and respective modification examples may be applied to a mounting structure including a first substrate provided with an electronic component such as a semiconductor IC, that is, an functional element, and a second substrate electrically connected to the first substrate, or an image display device or an image forming device in which the mounting structure is provided in a casing. In other words, a wiring portion which is provided on the first substrate and is connected to the electronic component and a conduction portion which is provided on the second substrate and is connected to the wiring portion are connected to each other further toward the second substrate side than the electronic component, and thus it is possible to prevent interference between the functional element and the conduction portion and thus to appropriately and easily perform wiring connection between the first substrate and the second substrate.

A specific structure when the invention is implemented may be configured as appropriate by combining the respective embodiments and modification examples within the scope of being capable of achieving the object of the invention, and may be changed to other structures as appropriate.

The entire disclosure of Japanese Patent Application No. 2016-161046 filed Aug. 19, 2016 is expressly incorporated by reference herein.

What is claimed is:

1. A mounting structure comprising:
a first substrate which has a first surface on which a functional element is provided;
a second substrate that has a second surface facing the first surface;
a wiring portion that is provided at a position which is different from a position of the functional element on the first surface, has a third surface facing the second surface, and is electrically connected to the functional element; and
a conduction portion that is provided on the second surface, protrudes toward the first surface, and is connected to the third surface so as to be electrically connected to the functional element,
wherein an area of the third surface is larger than an area of a first end section of the wiring portion on the first substrate side in a plan view which is viewed from a thickness direction of the first substrate and the second substrate.

2. The mounting structure according to claim 1,
wherein a second end section of the wiring portion on the second substrate side protrudes along the first surface.

3. The mounting structure according to claim 2,
wherein the wiring portion has a side surface ranging between the first end section and the second end section, and
wherein the side surface is a depressed surface which is depressed in a direction of becoming distant from the functional element on a side on which the functional element is disposed.

4. An electronic apparatus comprising:
the mounting structure according to claim 2; and
a control unit that controls the functional element.

5. An electronic apparatus comprising:
the mounting structure according to claim 3; and
a control unit that controls the functional element.

6. The mounting structure according to claim 1,
wherein the third surface has a projection protruding toward the second surface side.

7. An electronic apparatus comprising:
the mounting structure according to claim 6; and
a control unit that controls the functional element.

8. The mounting structure according to claim 1,
wherein the third surface has a depression which is depressed toward the first surface side.

9. The mounting structure according to claim 8,
wherein the conduction portion has a protrusion protruding toward the first surface side.

10. The mounting structure according to claim 9,
wherein the depression includes a spherical depression section which is curved at a first curvature,
wherein the protrusion includes a spherical projection section which is curved at a second curvature, and
wherein the first curvature is equal to or less than the second curvature.

11. An electronic apparatus comprising:
the mounting structure according to claim 10; and
a control unit that controls the functional element.

12. The mounting structure according to claim 9,
wherein the depression includes a spherical depression section which is curved at a first curvature,
wherein the protrusion includes a spherical projection section which is curved at a second curvature, and
wherein the first curvature is more than the second curvature.

13. An electronic apparatus comprising:
the mounting structure according to claim 12; and
a control unit that controls the functional element.

14. An electronic apparatus comprising:
the mounting structure according to claim 4; and
a control unit that controls the functional element.

15. An electronic apparatus comprising:
the mounting structure according to claim 8; and
a control unit that controls the functional element.

16. The mounting structure according to claim 1,
wherein the conduction portion has a fourth surface connected to the third surface, and
wherein at least one of the third surface and the fourth surface has a sliding preventing section preventing sliding between the third surface and the fourth surface.

17. The mounting structure according to claim 16,
wherein the sliding preventing section has irregularities.

18. The mounting structure according to claim 1,
wherein the conduction portion includes a resin section and a conductive film covering the resin section.

19. An electronic apparatus comprising:
the mounting structure according to claim 1; and
a control unit that controls the functional element.

* * * * *